(12) United States Patent
Wu et al.

(10) Patent No.: US 11,599,497 B2
(45) Date of Patent: *Mar. 7, 2023

(54) HIGH PERFORMANCE INTERCONNECT

(71) Applicant: Intel Corporation, Santa Clara, CA (US)

(72) Inventors: Zuoguo Wu, San Jose, CA (US); Debendra Das Sharma, Saratoga, CA (US); Mohiuddin M. Mazumder, San Jose, CA (US); Jong-Ru Guo, Portland, OR (US); Anupriya Sriramulu, Santa Clara, CA (US); Narasimha Lanka, Dublin, CA (US); Timothy Wig, Northborough, MA (US); Jeff Morriss, Los Gatos, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/008,363

(22) Filed: Aug. 31, 2020

(65) Prior Publication Data
US 2020/0394151 A1 Dec. 17, 2020

Related U.S. Application Data

(63) Continuation of application No. 15/636,738, filed on Jun. 29, 2017, now Pat. No. 10,789,201.
(Continued)

(51) Int. Cl.
G06F 15/173 (2006.01)
H01L 23/522 (2006.01)
(Continued)

(52) U.S. Cl.
CPC .......... *G06F 15/17343* (2013.01); *G06F 9/28* (2013.01); *G06F 15/16* (2013.01);
(Continued)

(58) Field of Classification Search
CPC ............ G06F 13/4027; G06F 13/4282; G06F 13/385; G06F 13/4265; G06F 11/221;
(Continued)

(56) References Cited

U.S. PATENT DOCUMENTS 8,599,913 B1 12/2013 Brown et al.
9,965,439 B2 * 5/2018 Das Sharma ....... G06F 13/4291
(Continued)

FOREIGN PATENT DOCUMENTS

WO 2018160497 A1 9/2018

OTHER PUBLICATIONS

Harding, Scharon, "What is PCIe? A Basic Definition", Feb. 8, 2021, Tom's Hardware, retrieved from the Internet on Aug. 16, 2021 at <https://www.tomshardware.com/reviews/pcie-definition,5754.html>.*

(Continued)

*Primary Examiner* — Faisal M Zaman
(74) *Attorney, Agent, or Firm* — Alliance IP, LLC

(57) ABSTRACT

A device includes a receiver to receive one or more training sequences during a training of a link, where the link connects two devices. The device may include agent logic to determine, from the one or more training sequences, a number of extension devices on the link between the two devices, and determine that the number of extension devices exceeds a threshold number. The device may include a transmitter to send a plurality of clock compensation ordered sets on the link based on determining that the number of extension devices exceeds a threshold number.

22 Claims, 20 Drawing Sheets

Related U.S. Application Data

(60) Provisional application No. 62/466,806, filed on Mar. 3, 2017.

(51) Int. Cl.
  *H03K 19/17736* (2020.01)
  *G06F 15/16* (2006.01)
  *H01L 21/768* (2006.01)
  *G06F 9/28* (2006.01)

(52) U.S. Cl.
  CPC .......... *G06F 15/173* (2013.01); *H01L 21/768* (2013.01); *H01L 23/5222* (2013.01); *H03K 19/17736* (2013.01)

(58) Field of Classification Search
  CPC ............... G06F 13/4022; G06F 11/263; G06F 15/17343; G06F 9/28; G06F 15/16; G06F 15/173; H04L 27/2613; H04L 2025/03426; H04L 27/2675; H01L 21/768; H01L 23/5222; H03K 19/17736
  USPC ................ 375/260, 267, 347; 370/442, 347; 710/105, 313, 305, 306, 315
  See application file for complete search history.

(56) References Cited

U.S. PATENT DOCUMENTS

| | | | |
|---|---|---|---|
| 10,789,201 B2* | 9/2020 | Wu | G06F 15/16 |
| 2003/0035504 A1 | 2/2003 | Wong et al. | |
| 2004/0071250 A1 | 4/2004 | Bunton et al. | |
| 2005/0144341 A1 | 6/2005 | Schmidt et al. | |
| 2005/0270988 A1 | 12/2005 | DeHaemer | |
| 2006/0156083 A1* | 7/2006 | Jang | G06F 13/423 |
| | | | 714/700 |
| 2007/0177701 A1* | 8/2007 | Thanigasalam | H04L 7/005 |
| | | | 375/372 |
| 2007/0201790 A1 | 8/2007 | Nakamura | |
| 2008/0056426 A1 | 3/2008 | Si et al. | |
| 2010/0272102 A1 | 10/2010 | Kobayashi | |
| 2010/0315135 A1* | 12/2010 | Lai | G06F 5/06 |
| | | | 327/145 |
| 2012/0204001 A1 | 8/2012 | Egger et al. | |
| 2013/0051483 A1* | 2/2013 | Wyatt | H04L 25/03885 |
| | | | 375/259 |
| 2013/0067127 A1* | 3/2013 | Hopgood | G06F 13/4282 |
| | | | 710/104 |
| 2014/0040526 A1 | 2/2014 | Chang et al. | |
| 2014/0129867 A1 | 5/2014 | Caruk et al. | |
| 2015/0370753 A1 | 12/2015 | Wagh et al. | |
| 2015/0378952 A1* | 12/2015 | Chen | G06F 13/423 |
| | | | 710/105 |
| 2016/0179647 A1 | 6/2016 | Sharma et al. | |
| 2016/0377679 A1 | 12/2016 | Froelich et al. | |
| 2017/0017604 A1 | 1/2017 | Chen et al. | |
| 2017/0163286 A1 | 6/2017 | Wu et al. | |
| 2017/0286348 A1* | 10/2017 | Kambhatla | G06F 13/4081 |
| 2017/0286359 A1 | 10/2017 | McGowan | |
| 2018/0181502 A1* | 6/2018 | Jen | G06F 13/4282 |
| 2018/0267850 A1* | 9/2018 | Froelich | G06F 11/1004 |
| 2019/0012286 A1* | 1/2019 | Benedict | G06F 13/4022 |

OTHER PUBLICATIONS

International Preliminary Report on Patentability issued in International Patent Application No. PCT/US2018/019764, dated Sep. 3, 2019; 13 pages.

International Search Report and Written Opinion in International Application No. PCT/US2018/019764, dated Jun. 11, 2018, 14 pages.

\* cited by examiner

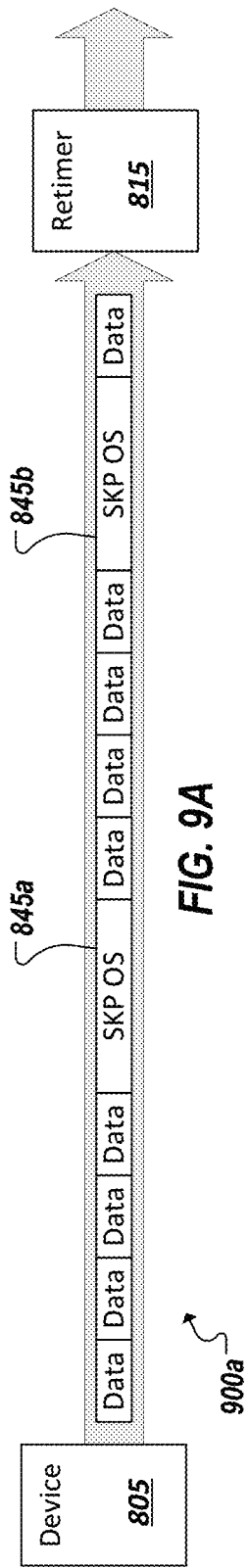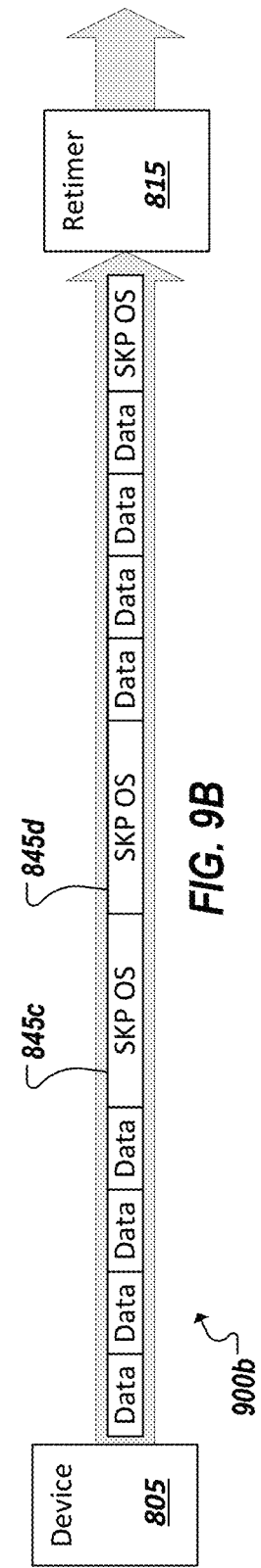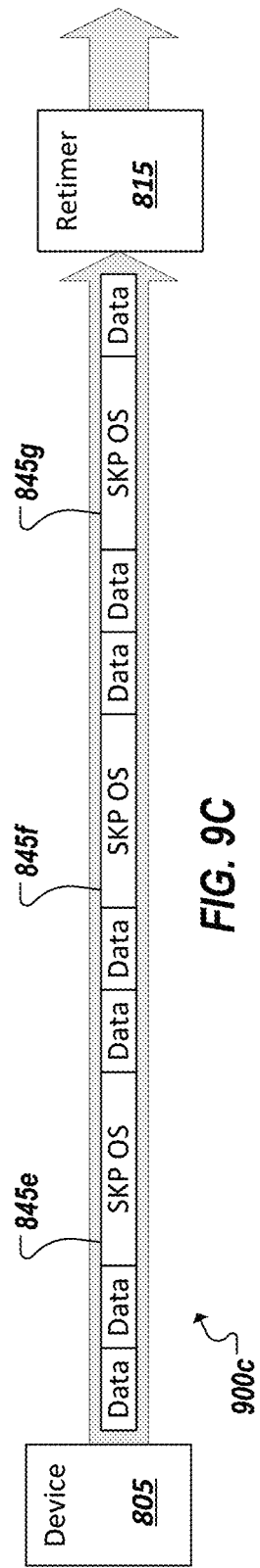

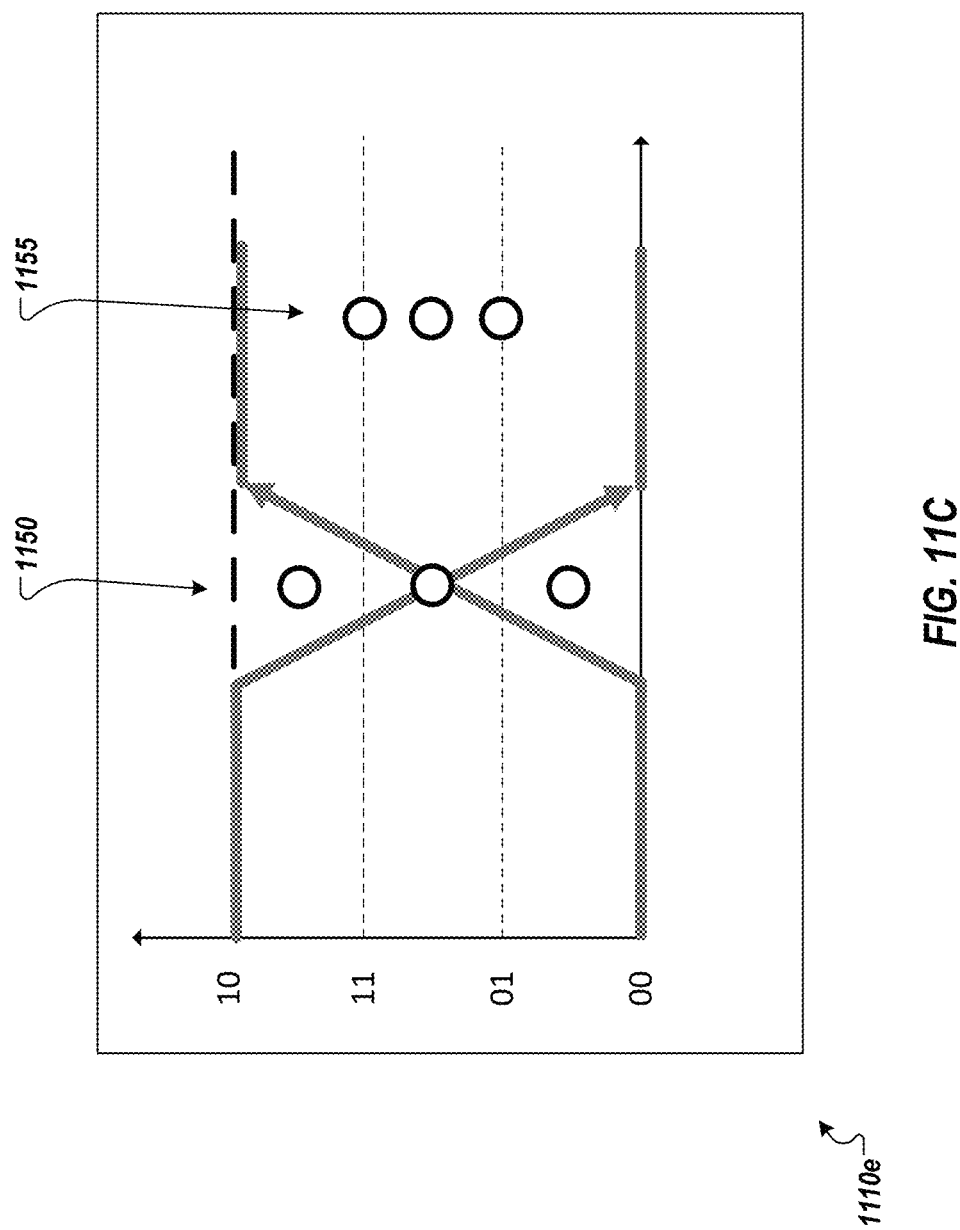

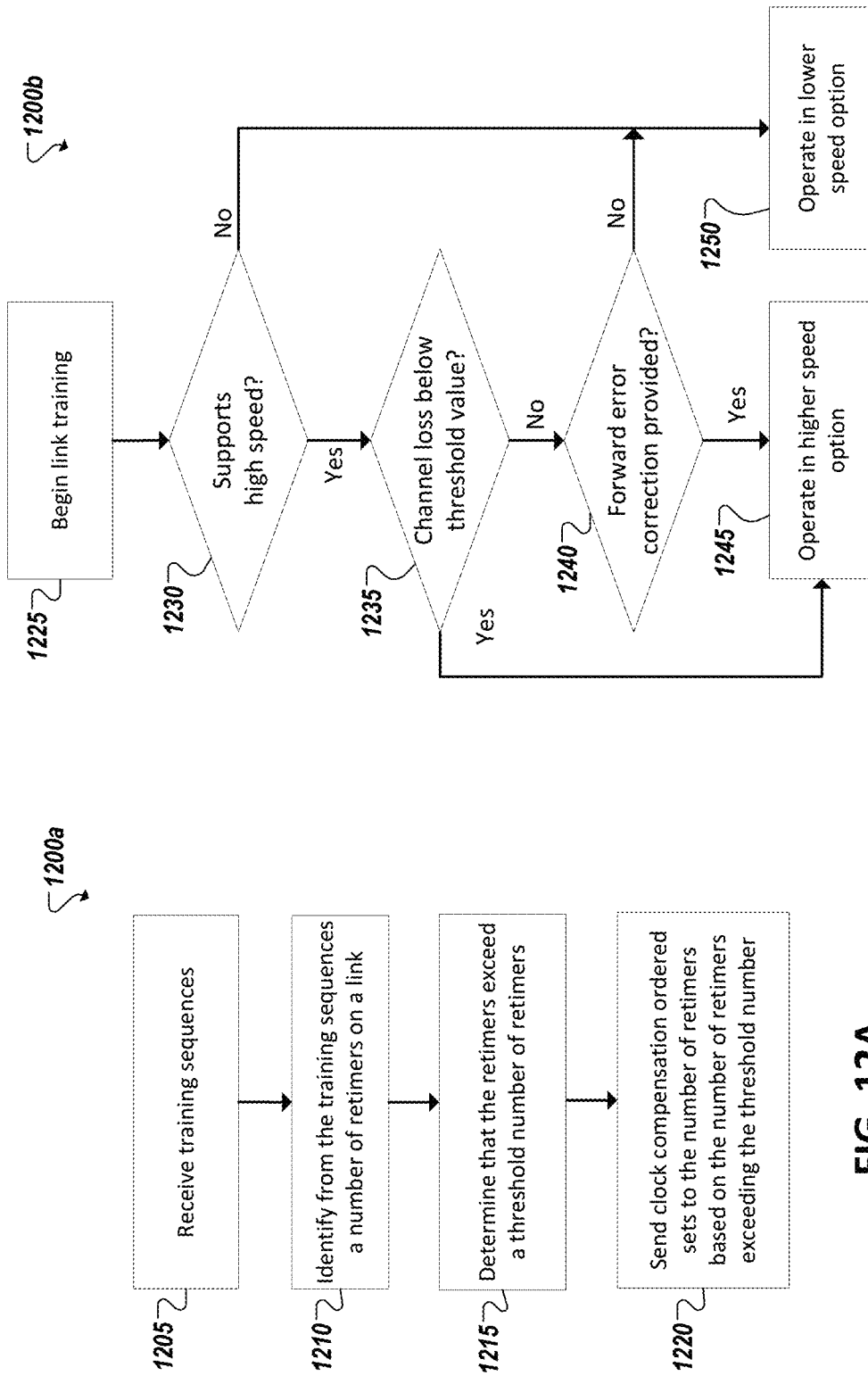

HIGH PERFORMANCE INTERCONNECT

RELATED APPLICATIONS

This application is a continuation (and claims the benefit of priority under 35 U.S.C. § 120) of U.S. application Ser. No. 15/636,738, filed on Jun. 29, 2017 and entitled HIGH PERFORMANCE INTERCONNECT, which application claims the benefit of U.S. Provisional Patent Application Ser. No. 62/466,806, filed Mar. 3, 2017. The disclosures of the prior applications are considered part of and are hereby incorporated by reference in their entirety in the disclosure of this application.

FIELD

This disclosure pertains to computing system, and in particular (but not exclusively) to point-to-point interconnects.

BACKGROUND

Advances in semi-conductor processing and logic design have permitted an increase in the amount of logic that may be present on integrated circuit devices. As a corollary, computer system configurations have evolved from a single or multiple integrated circuits in a system to multiple cores, multiple hardware threads, and multiple logical processors present on individual integrated circuits, as well as other interfaces integrated within such processors. A processor or integrated circuit typically comprises a single physical processor die, where the processor die may include any number of cores, hardware threads, logical processors, interfaces, memory, controller hubs, etc.

As a result of the greater ability to fit more processing power in smaller packages, smaller computing devices have increased in popularity. Smartphones, tablets, ultrathin notebooks, and other user equipment have grown exponentially. However, these smaller devices are reliant on servers both for data storage and complex processing that exceeds the form factor. Consequently, the demand in the high-performance computing market (i.e. server space) has also increased. For instance, in modern servers, there is typically not only a single processor with multiple cores, but also multiple physical processors (also referred to as multiple sockets) to increase the computing power. But as the processing power grows along with the number of devices in a computing system, the communication between sockets and other devices becomes more critical.

In fact, interconnects have grown from more traditional multi-drop buses that primarily handled electrical communications to full blown interconnect architectures that facilitate fast communication. Unfortunately, as the demand for future processors to consume at even higher-rates corresponding demand is placed on the capabilities of existing interconnect architectures.

BRIEF DESCRIPTION OF THE DRAWINGS

FIGS. 9A-9C illustrate simplified block diagrams of data that may be sent on an example link including one or more retimer devices.

FIGS. 11A-11C are diagrams illustrating an implementation of a pulse amplitude modulation (PAM)-based link.

FIGS. 12A-12B are flowcharts illustrating example techniques in connection with a high performance interconnect.

DETAILED DESCRIPTION

Figure 1:
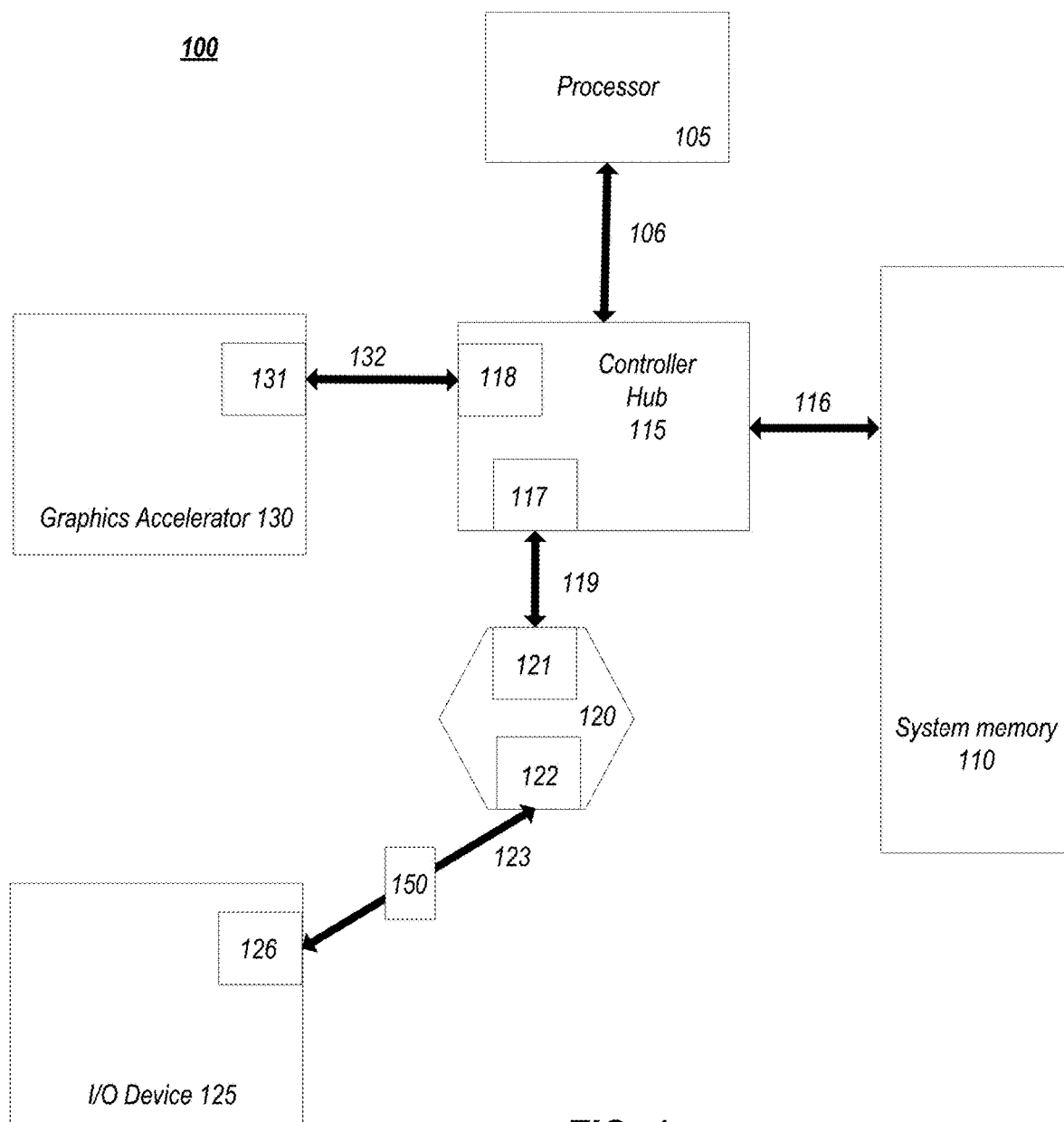
FIG. 1 illustrates an embodiment of a computing system including an interconnect architecture.

In the following description, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present invention. It will be apparent, however, to one skilled in the art that these specific details need not be employed to practice the present invention. In other instances, well known components or methods, such as specific and alternative processor architectures, specific logic circuits/code for described algorithms, specific firmware code, specific interconnect operation, specific logic configurations, specific manufacturing techniques and materials, specific compiler implementations, specific expression of algorithms in code, specific power down and gating techniques/logic and other specific operational details of computer system haven't been described in detail in order to avoid unnecessarily obscuring the present invention.

Although the following embodiments may be described with reference to energy conservation and energy efficiency in specific integrated circuits, such as in computing platforms or microprocessors, other embodiments are applicable to other types of integrated circuits and logic devices. Similar techniques and teachings of embodiments described herein may be applied to other types of circuits or semiconductor devices that may also benefit from better energy efficiency and energy conservation. For example, the disclosed embodiments are not limited to desktop computer systems or Ultrabooks™. And may be also used in other devices, such as handheld devices, tablets, other thin notebooks, systems on a chip (SOC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. Moreover, the apparatus', methods, and systems described herein are not limited to physical computing devices, but may also relate to software optimizations for energy conservation and efficiency. As will become readily apparent in the description below, the embodiments of methods, apparatus', and systems described herein (whether in reference to hardware, firmware, software, or a combination thereof) are vital to a 'green technology' future balanced with performance considerations.

As computing systems are advancing, the components therein are becoming more complex. As a result, the interconnect architecture to couple and communicate between the components is also increasing in complexity to ensure bandwidth requirements are met for optimal component operation. Furthermore, different market segments demand different aspects of interconnect architectures to suit the market's needs. For example, servers require higher performance, while the mobile ecosystem is sometimes able to sacrifice overall performance for power savings. Yet, it's a singular purpose of most fabrics to provide highest possible performance with maximum power saving. Below, a number of interconnects are discussed, which would potentially benefit from aspects of the invention described herein.

One interconnect fabric architecture includes the Peripheral Component Interconnect (PCI) Express (PCIe) architecture. A primary goal of PCIe is to enable components and devices from different vendors to inter-operate in an open architecture, spanning multiple market segments; Clients (Desktops and Mobile), Servers (Standard and Enterprise), and Embedded and Communication devices. PCI Express is a high performance, general purpose I/O interconnect defined for a wide variety of future computing and communication platforms. Some PCI attributes, such as its usage model, load-store architecture, and software interfaces, have been maintained through its revisions, whereas previous parallel bus implementations have been replaced by a highly scalable, fully serial interface. The more recent versions of PCI Express take advantage of advances in point-to-point interconnects, Switch-based technology, and packetized protocol to deliver new levels of performance and features. Power Management, Quality Of Service (QoS), Hot-Plug/Hot-Swap support, Data Integrity, and Error Handling are among some of the advanced features supported by PCI Express.

Referring to FIG. 1, an embodiment of a fabric composed of point-to-point Links that interconnect a set of components is illustrated. System 100 includes processor 105 and system memory 110 coupled to controller hub 115. Processor 105 includes any processing element, such as a microprocessor, a host processor, an embedded processor, a co-processor, or other processor. Processor 105 is coupled to controller hub 115 through front-side bus (FSB) 106. In one embodiment, FSB 106 is a serial point-to-point interconnect as described below. In another embodiment, link 106 includes a serial, differential interconnect architecture that is compliant with different interconnect standard.

System memory 110 includes any memory device, such as random access memory (RAM), non-volatile (NV) memory, or other memory accessible by devices in system 100. System memory 110 is coupled to controller hub 115 through memory interface 116. Examples of a memory interface include a double-data rate (DDR) memory interface, a dual-channel DDR memory interface, and a dynamic RAM (DRAM) memory interface.

In one embodiment, controller hub 115 is a root hub, root complex, or root controller in a Peripheral Component Interconnect Express (PCIe or PCIE) interconnection hierarchy. Examples of controller hub 115 include a chipset, a memory controller hub (MCH), a northbridge, an interconnect controller hub (ICH) a southbridge, and a root controller/hub. Often the term chipset refers to two physically separate controller hubs, i.e. a memory controller hub (MCH) coupled to an interconnect controller hub (ICH). Note that current systems often include the MCH integrated with processor 105, while controller 115 is to communicate with I/O devices, in a similar manner as described below. In some embodiments, peer-to-peer routing is optionally supported through root complex 115.

Here, controller hub 115 is coupled to switch/bridge 120 through serial link 119. Input/output modules 117 and 121, which may also be referred to as interfaces/ports 117 and 121, include/implement a layered protocol stack to provide communication between controller hub 115 and switch 120. In one embodiment, multiple devices are capable of being coupled to switch 120.

Switch/bridge 120 routes packets/messages from device 125 upstream, i.e. up a hierarchy towards a root complex, to controller hub 115 and downstream, i.e. down a hierarchy away from a root controller, from processor 105 or system memory 110 to device 125. Switch 120, in one embodiment, is referred to as a logical assembly of multiple virtual PCI-to-PCI bridge devices. Device 125 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Firewire device, a Universal Serial Bus (USB) device, a scanner, and other input/output devices. Often in the PCIe vernacular, such as device, is referred to as an endpoint. Although not specifically shown, device 125 may include a PCIe to PCI/PCI-X bridge to support legacy or other version PCI devices. Endpoint devices in PCIe are often classified as legacy, PCIe, or root complex integrated endpoints.

Graphics accelerator 130 is also coupled to controller hub 115 through serial link 132. In one embodiment, graphics accelerator 130 is coupled to an MCH, which is coupled to an ICH. Switch 120, and accordingly I/O device 125, is then coupled to the ICH. I/O modules 131 and 118 are also to implement a layered protocol stack to communicate between graphics accelerator 130 and controller hub 115. Similar to the MCH discussion above, a graphics controller or the graphics accelerator 130 itself may be integrated in processor 105. Further, one or more links (e.g., 123) of the system can include one or more extension devices (e.g., 150), such as retimers, repeaters, etc.

Figure 2:
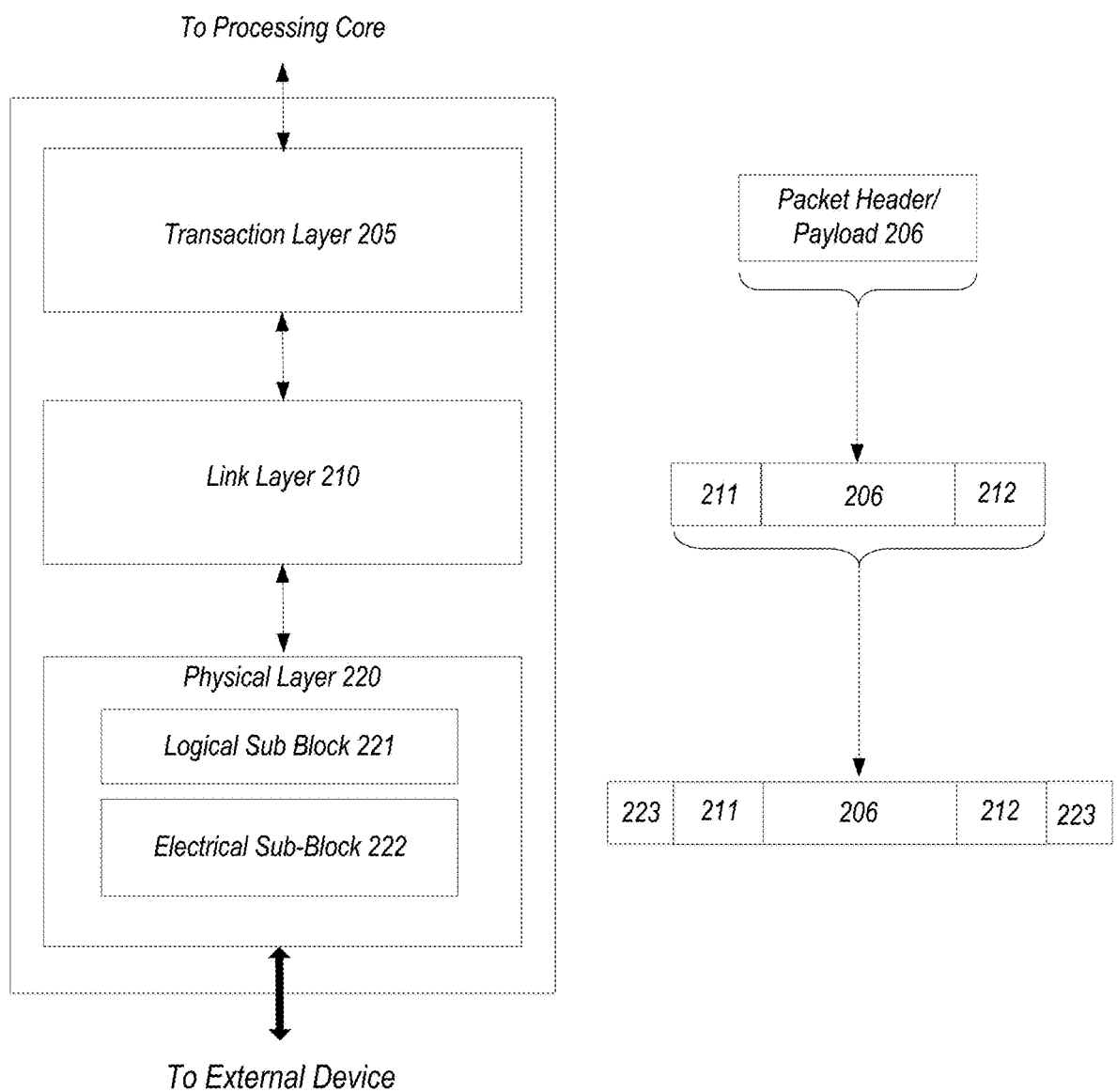
FIG. 2 illustrates an embodiment of a interconnect architecture including a layered stack.

Turning to FIG. 2 an embodiment of a layered protocol stack is illustrated. Layered protocol stack 200 includes any form of a layered communication stack, such as a Quick Path Interconnect (QPI) stack, a PCie stack, a next generation high performance computing interconnect stack, or other layered stack. Although the discussion immediately below in reference to FIGS. 1-4 are in relation to a PCIe stack, the same concepts may be applied to other interconnect stacks. In one embodiment, protocol stack 200 is a PCIe protocol stack including transaction layer 205, link layer 210, and physical layer 220. An interface, such as interfaces 117, 118, 121, 122, 126, and 131 in FIG. 1, may be represented as communication protocol stack 200. Representation as a communication protocol stack may also be referred to as a module or interface implementing/including a protocol stack.

PCI Express uses packets to communicate information between components. Packets are formed in the Transaction Layer 205 and Data Link Layer 210 to carry the information from the transmitting component to the receiving component. As the transmitted packets flow through the other layers, they are extended with additional information necessary to handle packets at those layers. At the receiving side the reverse process occurs and packets get transformed from their Physical Layer 220 representation to the Data Link Layer 210 representation and finally (for Transaction Layer Packets) to the form that can be processed by the Transaction Layer 205 of the receiving device.

Transaction Layer

In one embodiment, transaction layer 205 is to provide an interface between a device's processing core and the interconnect architecture, such as data link layer 210 and physical layer 220. In this regard, a primary responsibility of the transaction layer 205 is the assembly and disassembly of packets (i.e., transaction layer packets, or TLPs). The translation layer 205 typically manages credit-base flow control for TLPs. PCIe implements split transactions, i.e. transactions with request and response separated by time, allowing a link to carry other traffic while the target device gathers data for the response.

In addition PCIe utilizes credit-based flow control. In this scheme, a device advertises an initial amount of credit for each of the receive buffers in Transaction Layer 205. An external device at the opposite end of the link, such as controller hub 115 in FIG. 1, counts the number of credits consumed by each TLP. A transaction may be transmitted if the transaction does not exceed a credit limit. Upon receiving a response an amount of credit is restored. An advantage of a credit scheme is that the latency of credit return does not affect performance, provided that the credit limit is not encountered.

In one embodiment, four transaction address spaces include a configuration address space, a memory address space, an input/output address space, and a message address space. Memory space transactions include one or more of read requests and write requests to transfer data to/from a memory-mapped location. In one embodiment, memory space transactions are capable of using two different address formats, e.g., a short address format, such as a 32-bit address, or a long address format, such as 64-bit address. Configuration space transactions are used to access configuration space of the PCIe devices. Transactions to the configuration space include read requests and write requests. Message space transactions (or, simply messages) are defined to support in-band communication between PCIe agents.

Therefore, in one embodiment, transaction layer 205 assembles packet header/payload 206. Format for current packet headers/payloads may be found in the PCIe specification at the PCIe specification website.

Figure 3:
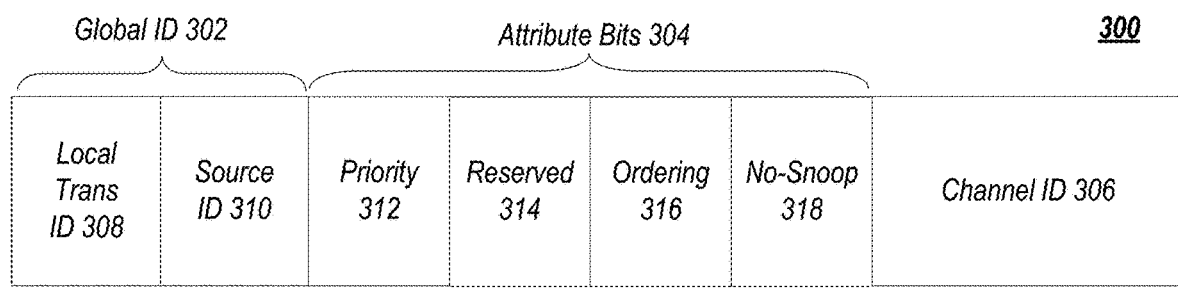
FIG. 3 illustrates an embodiment of a request or packet to be generated or received within an interconnect architecture.

Quickly referring to FIG. 3, an embodiment of a PCIe transaction descriptor is illustrated. In one embodiment, transaction descriptor 300 is a mechanism for carrying transaction information. In this regard, transaction descriptor 300 supports identification of transactions in a system. Other potential uses include tracking modifications of default transaction ordering and association of transaction with channels.

Transaction descriptor 300 includes global identifier field 302, attributes field 304 and channel identifier field 306. In the illustrated example, global identifier field 302 is depicted comprising local transaction identifier field 308 and source identifier field 310. In one embodiment, global transaction identifier 302 is unique for all outstanding requests.

According to one implementation, local transaction identifier field 308 is a field generated by a requesting agent, and it is unique for all outstanding requests that require a completion for that requesting agent. Furthermore, in this example, source identifier 310 uniquely identifies the requestor agent within a PCIe hierarchy. Accordingly, together with source ID 310, local transaction identifier 308 field provides global identification of a transaction within a hierarchy domain.

Attributes field 304 specifies characteristics and relationships of the transaction. In this regard, attributes field 304 is potentially used to provide additional information that allows modification of the default handling of transactions. In one embodiment, attributes field 304 includes priority field 312, reserved field 314, ordering field 316, and no-snoop field 318. Here, priority sub-field 312 may be modified by an initiator to assign a priority to the transaction. Reserved attribute field 314 is left reserved for future, or vendor-defined usage. Possible usage models using priority or security attributes may be implemented using the reserved attribute field.

In this example, ordering attribute field 316 is used to supply optional information conveying the type of ordering that may modify default ordering rules. According to one example implementation, an ordering attribute of "0" denotes default ordering rules are to apply, wherein an ordering attribute of "1" denotes relaxed ordering, wherein writes can pass writes in the same direction, and read completions can pass writes in the same direction. Snoop attribute field 318 is utilized to determine if transactions are snooped. As shown, channel ID Field 306 identifies a channel that a transaction is associated with.

Link Layer

Link layer 210, also referred to as data link layer 210, acts as an intermediate stage between transaction layer 205 and the physical layer 220. In one embodiment, a responsibility of the data link layer 210 is providing a reliable mechanism for exchanging Transaction Layer Packets (TLPs) between two components a link. One side of the Data Link Layer 210 accepts TLPs assembled by the Transaction Layer 205, applies packet sequence identifier 211, i.e. an identification number or packet number, calculates and applies an error detection code, i.e. CRC 212, and submits the modified TLPs to the Physical Layer 220 for transmission across a physical to an external device.

Physical Layer

In one embodiment, physical layer 220 includes logical sub block 221 and electrical sub-block 222 to physically transmit a packet to an external device. Here, logical sub-block 221 is responsible for the "digital" functions of Physical Layer 221. In this regard, the logical sub-block includes a transmit section to prepare outgoing information for transmission by physical sub-block 222, and a receiver section to identify and prepare received information before passing it to the Link Layer 210.

Physical block 222 includes a transmitter and a receiver. The transmitter is supplied by logical sub-block 221 with symbols, which the transmitter serializes and transmits onto to an external device. The receiver is supplied with serialized symbols from an external device and transforms the received signals into a bit-stream. The bit-stream is de-serialized and supplied to logical sub-block 221. In one embodiment, an 8*b*/10*b* transmission code is employed, where ten-bit symbols are transmitted/received. Here, special symbols are used to frame a packet with frames 223. In addition, in one example, the receiver also provides a symbol clock recovered from the incoming serial stream.

As stated above, although transaction layer 205, link layer 210, and physical layer 220 are discussed in reference to a specific embodiment of a PCIe protocol stack, a layered protocol stack is not so limited. In fact, any layered protocol may be included/implemented. As an example, an port/interface that is represented as a layered protocol includes: (1) a first layer to assemble packets, i.e. a transaction layer; a second layer to sequence packets, i.e. a link layer; and a third layer to transmit the packets, i.e. a physical layer. As a specific example, a common standard interface (CSI) layered protocol is utilized.

Figure 4:
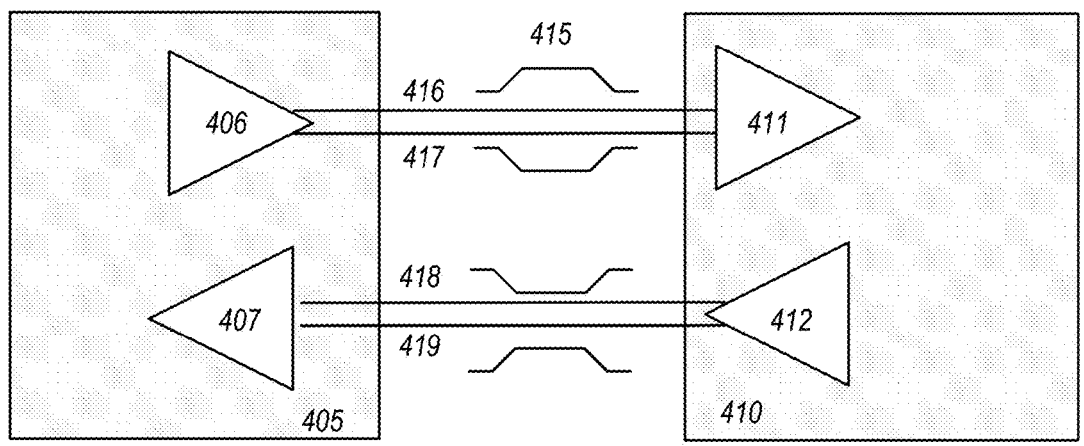
FIG. 4 illustrates an embodiment of a transmitter and receiver pair for an interconnect architecture.

Referring next to FIG. 4, an embodiment of a PCIe serial point to point fabric is illustrated. Although an embodiment of a PCIe serial point-to-point link is illustrated, a serial point-to-point link is not so limited, as it includes any transmission path for transmitting serial data. In the embodiment shown, a basic PCIe link includes two, low-voltage, differentially driven signal pairs: a transmit pair 406/411 and a receive pair 412/407. Accordingly, device 405 includes transmission logic 406 to transmit data to device 410 and receiving logic 407 to receive data from device 410. In other words, two transmitting paths, i.e. paths 416 and 417, and two receiving paths, i.e. paths 418 and 419, are included in a PCIe link.

A transmission path refers to any path for transmitting data, such as a transmission line, a copper line, an optical line, a wireless communication channel, an infrared communication link, or other communication path. A connection between two devices, such as device 405 and device 410, is referred to as a link, such as link 415. A link may support one lane—each lane representing a set of differential signal pairs (one pair for transmission, one pair for reception). To scale bandwidth, a link may aggregate multiple lanes denoted by xN, where N is any supported Link width, such as 1, 2, 4, 8, 12, 16, 32, 64, or wider.

A differential pair refers to two transmission paths, such as lines 416 and 417, to transmit differential signals. As an example, when line 416 toggles from a low voltage level to a high voltage level, i.e. a rising edge, line 417 drives from a high logic level to a low logic level, i.e. a falling edge. Differential signals potentially demonstrate better electrical characteristics, such as better signal integrity, i.e. cross-coupling, voltage overshoot/undershoot, ringing, etc. This allows for better timing window, which enables faster transmission frequencies.

In some implementations, a high-performance interconnect and corresponding interconnect protocol (e.g., such as a next generation PCIe-based interconnect) may be provided that is capable of operating at high speeds such as 25 GT/s and/or 32 GT/s. In one example, two speeds may be defined for the high performance interconnect, one at 25 GT/s and 32 GT/s, based on the characteristics determined for the channel (e.g., during link training). The interconnect, in one implementation, may be backwards compatible with existing PCIe generations and speeds provided for these generations (e.g., 8 GT/s, 16 GT/s, etc.). In one example, the interconnect may be defined to provide a channel loss less than or equal to 35 dB at Nyquist frequency for 25 GT/s and 32 GT/s non-return to zero (NRZ) speeds (e.g., at frequencies 12.5 GHz and 16 GHz respectively), and a channel loss of 20 dB at 8 GHz. A chip package, connector, and board may be configured to remove resonance up to the 16 GHz Nyquist rate. In some implementations, Forward Error Correction (FEC) may be utilized to allow a channel to support the higher defined speeds of the interconnect.

As noted above, two data rates may be defined for links established according to the interconnect protocol. In some implementations, the data rate applied may be based on the channel type characteristics and/or whether extension devices (e.g., retimers) are present on the link. For instance, a higher speed (e.g., 32 GT/s) may adopted if the channel loss is within a certain threshold across all Link segments (e.g., 35 dB at 16 GHz) or if a Forward Error Correction mechanism is enabled to allow the link to otherwise meet the threshold (e.g., 35 dB) (albeit at the expense of a latency hit). If it is determined (e.g., during training) that the link does not satisfied the criteria for the higher speed, a lower defined speed (e.g., 25 GT/s) may be selected and used. In one example, the speeds defined for the interconnect may be provided as additional link speed options (e.g., in addition to link speeds defined for PCIe generations 1.0-4.0). To accommodate these additional speeds, one or more bits and/or encodings may be defined in training sequences and/or ordered sets (and corresponding registers) to identify the added speeds (e.g., 25 GT/s and 32 GT/s), among other examples. For instance, bits may be provided (e.g., in training sequences, ordered sets, or a sideband channel) to indicate whether a highest (e.g., 32 GT/s) data rate is supported, whether channel loss is below a defined threshold (e.g., less than 35 dB), and whether FEC is supported by the receiver agent on either end of the link, among other examples. In one example, a channel loss threshold may be overridden, for instance, given the presence of one or more retimers to indicate that channel loss is greater than 35 dB. Based on information (e.g., embodied in bits provided in the training sequences used by the components during link training) identifying whether each link partner supports the highest speed(s), utilizes FEC, and recognizes a channel within the acceptable loss threshold (e.g., 35 dB), the link partner devices may determine the speed to be applied on the link connecting the devices.

In addition to supporting higher link speeds, an enhanced high performance interconnect may additional permit higher link widths, such as x20, x24, x28, and x32 lane widths. Such increased link widths may be supported both in the base specifications for the interconnect, as well as in the various form-factor specifications (e.g., electromechanical, soldered on board, etc.) with a configuration state being used to determine the link width. As an example, an x20 width at 25 GT/s can support next generation networking speed of 400 Gb/s with the traditional 25% extra bandwidth set aside for overheads across various layers (e.g., physical, link, transaction, etc.) as well as the overheads associated with exchanging descriptors and other control traffic between the networking controller and the root port, among other examples.

Additional example features may be adopted in an implementation of a high performance interconnect, such as a PCIe-based interconnect. In some implementations, unit interval (UI)-based jitter scaling may be implemented. Circuits may also be enhanced to support a high performance interconnect. For instance, continuous time linear equalization (CTLE) may be extended with multiple poles and zeroes, a minimum of 10 dB direct current (DC) to alternating current (AC) peaking, with one low frequency zero (e.g., ~250 MHz). Table 1 illustrates the pole and zero locations in one example implementation of a CTLE in accordance with a high performance interconnect, such as a modified PCIe-based interconnect supporting speeds of 25 GT/s and/or 32 GT/s:

TABLE 1

CTLE Pole/Zero example

| CTLE Curve | Zero 1 | Zero 2 | Zero 3 | Pole 1 | Pole 2 | Pole 3 | Pole 4 | Pole 5 |
|---|---|---|---|---|---|---|---|---|
| 1 | 250M | 2.3 G | 5 G | 325M | 8 G | 15 G | 28 G | 28 G |
| 2 | 250M | 2.3 G | 5 G | 325M | 8 G | 12 G | 28 G | 28 G |
| 3 | 250M | 2.3 G | NA | 325M | NA | 15 G | 28 G | 28 G |
| 4 | 450M | 3.2 G | NA | 700M | NA | 12.8 G | 28 G | 28 G |

As another example, a multi-tap decision feedback equalizer (DFE) circuit may be provided. For instance, for NRZ, a loop unrolling circuit architecture may be implemented to relief the timing requirement for the first feedback tap. In implementations utilizing, pulse amplitude modulation (PAM) (e.g., PAM4) summer linearity improvement may be desired. As another example circuit enhancement, pad capacitance may be reduced to achieve 0.2 pF. For instance, inductive peaking and T-coil (or Pi-coil) may be used, among other example implementations.

Figure 5:
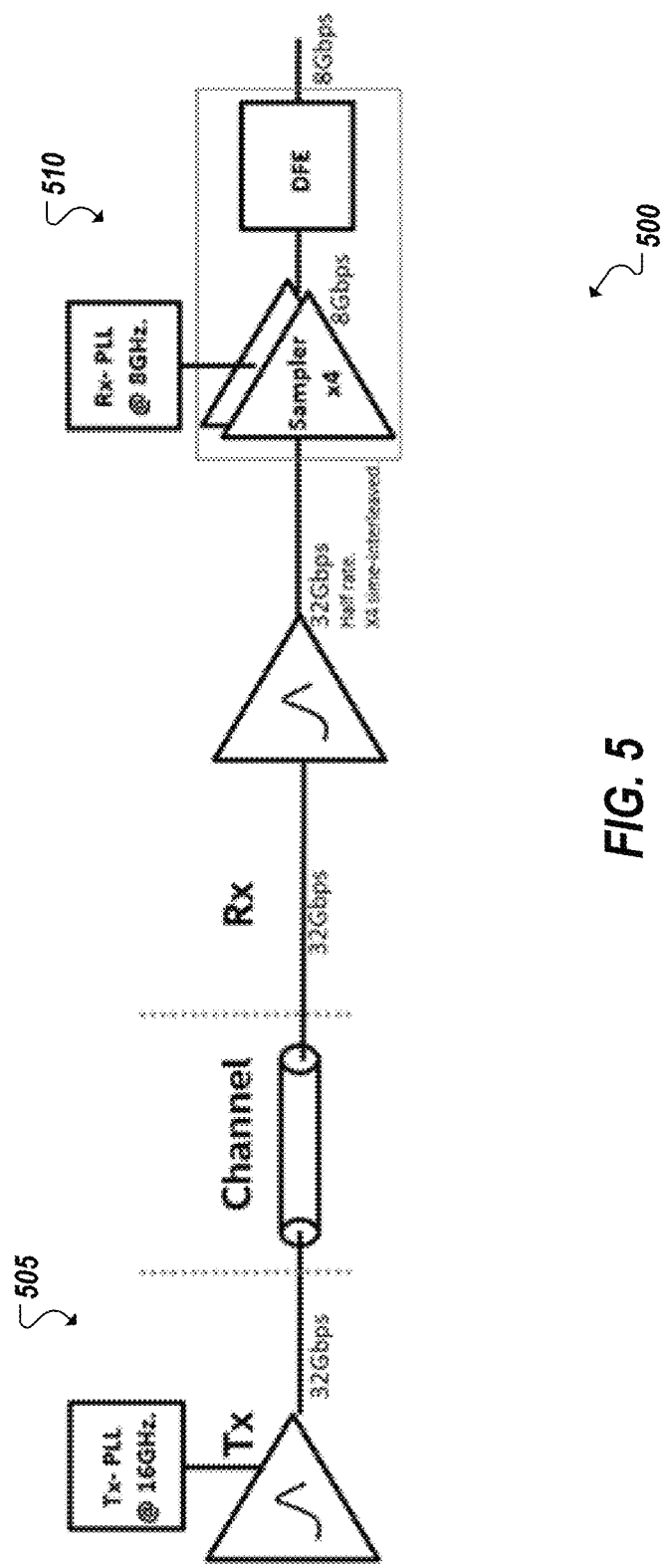
FIG. 5 illustrates a simplified block diagram of an example link channel.

Turning to the simplified circuit diagram 500 of FIG. 5, an example implementation of a clocking circuit is illustrated, which may be implemented in some systems supporting the example high performance interconnect. As shown in this example, a four-way interleaving clocking architecture may be utilized to support high speed clocking, such in a 32 Gb/s NRZ implementation. This may allow, for instance, for clock distribution to be kept at the same speed as supported in an earlier generation implementation (e.g., PCIe4), but with the addition of more phases. This may allow the clock crystal to be configured at these lower speeds, while supporting the higher, next-generation speeds. Moreover, the same clock speed need not be applied at both the transmitter circuitry (Tx) 505 and receiver (Rx) 510 circuitry of a device, as shown in the example of FIG. 5. For instance, it may be easier to run at faster speeds on the Tx 505 (e.g., 16 GT/s) than on the Rx 510 (e.g., at 8 GT/s). For instance, the example FIG. 5 shows a four-way interleaved receiver Rx 510. In some implementations, an IQ balancing circuit may be further provided (as well as other example components, such as shown in the example of FIG. 5), among other example implementations.

Figure 6A:
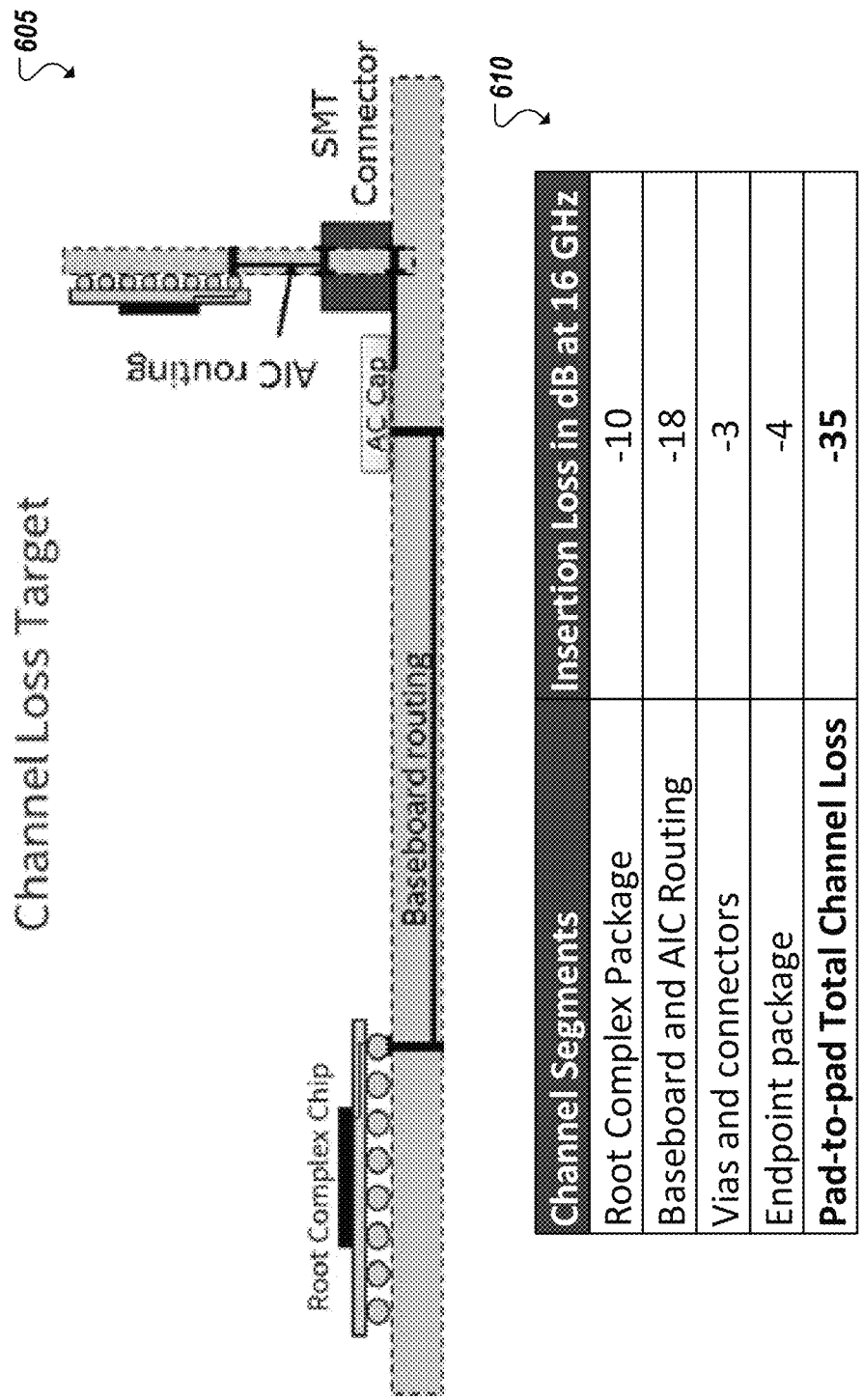
FIG. 6A illustrates a block diagram showing example channel loss allowances for an example channel.
Figure 6B:
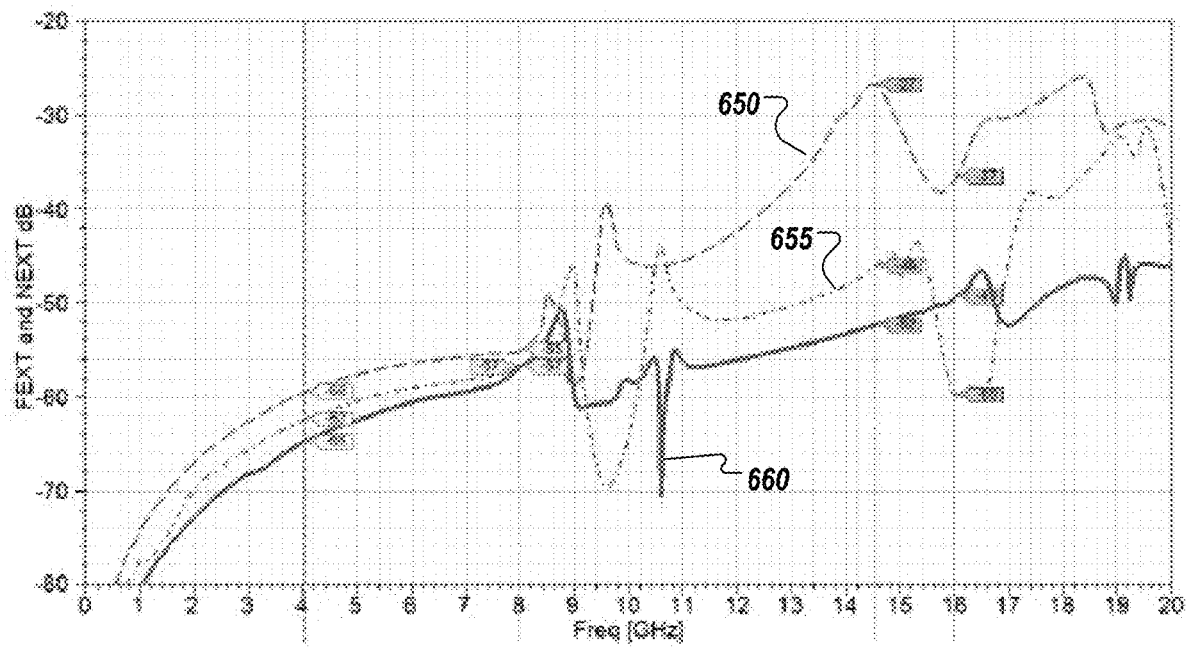
FIGS. 6B-6C are graphs showing example channel loss behavior.
Figure 6C:
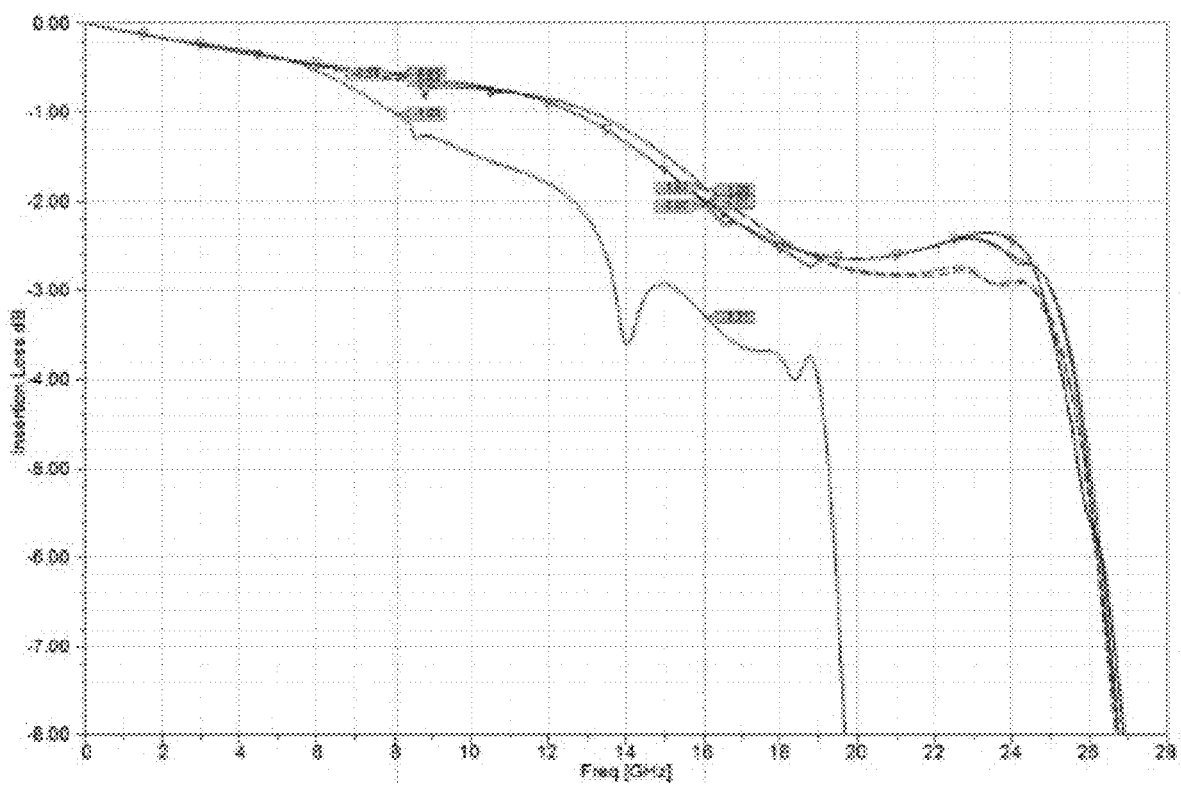

Turning to the examples of FIGS. 6A-6C, an example implementation of a system, and composite circuitry, implementing a high performance interconnect, such as discussed herein, may be implemented to realize die-pad-to-die-pad channel loss within −35 dB at 16 GHz. Further, components may be provided to minimize impedance discontinuity and crosstalk across all channel components, while improving 3D physical elements such as connectors, sockets, and vias to dampen or eliminate resonances that may be present in earlier generation or legacy topologies in a frequency corresponding to the high performance interconnect (e.g., the frequency range of 8-16 GHz).

As illustrated in FIG. 6A, an example implementation of a channel 605 and the composite components of the channel are illustrated. In one example, a worst-case die-pa-to-die-pad channel loss may be defined for −35 dB at 16 GHz. This may be achieved, for instance, by limiting root complex package loss to −10 dB, endpoint package loss to −4 dB, connector and via losses to −3 dB, and routing losses to −18 dB (e.g., corresponding to total system plus add-in-card), and 12 inch routing at 1.5 dB/inch loss at 16 GHz. FIG. 6 shows the loss breakdown 610 for various channel components of an example PCIe topology. In one example, on-die inductors or other filter circuits may be used to control the return loss characteristics of the transmitter and receiver to achieve the desired loss targets. To maintain form-factor backward compatibility with CEM connector slots, structural changes in both surface-mount (SMT), and through-hole-mount (THM) PCIe connectors may be provided to minimize and/or push out the resonances beyond 16 GHz and thereby reduce the far-end crosstalk (FEXT) below −40 dB up to 16 GHz. In addition, a special grounding scheme within the connector body may be implemented, as well as the placement of ground vias in the system board and add-in-card to further reduce crosstalk and impedance discontinuity, among other example implementations and advantages.

Turning to FIG. 6B, a graph 600b is shown, where the dashed curve 650 shows the far-end crosstalk simulation results for a baseline PCIe Gen4 surface mount (SMT) connector. The graph 600b of FIG. 6B further shows a second dashed curve 655 showing improvement in crosstalk with some additional grounding, while maintaining connector structure. The solid curve 660 shows improvement when the grounding scheme is combined with some additional structural changes (albeit without requiring mechanical slot compatibility). In some implementation, a four-fold (>12 dB) improvement in crosstalk may be achievable compared to PCIe Gen4 SMT connector. FIG. 6C is a graph 600c showing an insertion loss curve for the baseline and improved SMT connectors. The 3 dB bandwidth can be extended from 13.7 GHz to 24.5 GHz to enable 32 Gb/s signaling. The package and board vias may be significant contributors to signal degradation at 25 and 32 Gb/s through increased reflection and crosstalk. The negative impact of vias may be minimized, in some implementations, through controlled voiding around signal vias for reduced capacitance. In addition, the crosstalk impact from vertical components such as vias, socket pins, ball grid array (BGA) balls, and connector pins may be reduced by implementing signal and ground via placements such that symmetry of differential signals provide maximum crosstalk cancellation, among other example implementations.

In some implementations, a link, such as a PCIe-compliant link, can include one or more retimers or other extension devices, such as a repeater. A retimer device (or simply "retimer"), can include active electronic devices that receive and re-transmit (retime) digital I/O signals. Re-timers can be used to extend the length of a channel that can be used with a digital I/O bus. Retimers can be protocol aware, software transparent, and capable of executing a link equalization procedure, such as the link equalization procedure of PCIe. A link incorporating one or more retimers can form two or more separate electrical sub-links at data rates comparable to data rates realized by links employing similar protocols but with no retimers. For instance, a link including a single retimer can form a link with two separate sub-links, each operating at a speed, such as speeds of 8 GT/s, 16 GT/s, 25 GT/s, 32.0 GT/s, or higher.

Figures 7A, 7B:
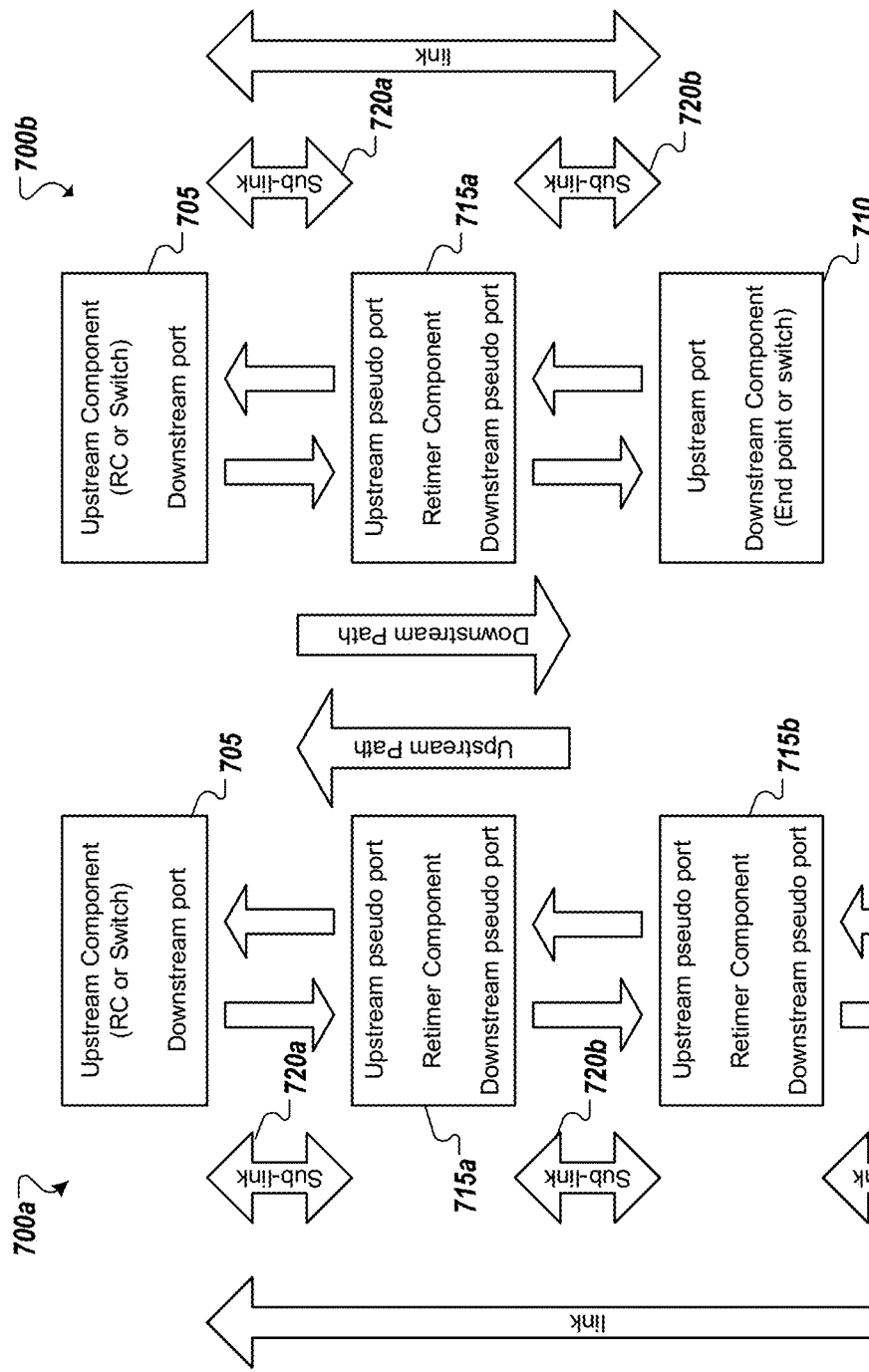
FIGS. 7A-7B illustrate simplified block diagrams of example links including one or more extension devices.

FIGS. 7A-7B illustrate simplified block diagrams 700a-b of example links including one or more retimers. For instance, in FIG. 7A, a link connecting a first component 705 (e.g., an upstream component) to a second component 710 (e.g., a downstream component) can include a single retimer 715a. A first sublink 720a can connect the first component 705 to the retimer 715a and a second sublink 720b can connect the retimer 715a to the second component. As shown in FIG. 7B, multiple retimers 715a, 715b can be utilized to extend a link. Three sublinks 720a-c can be defined through the two retimers 715a, 715b, with a first sublink 715a connecting the first component to the first retimer 715a, a second sublink connecting the first retimer 715a to the second retimer 715b, and the third sublink 715c connecting the second retimer 715b to the second component.

As shown in the examples of FIGS. 7A-7B, a retimer can include two pseudo ports, and the pseudo ports can determine their respective downstream/upstream orientation dynamically. Each retimer 715a, 715b can have an upstream path and a downstream path. Further, retimers 715a, 715b can support operating modes including a forwarding mode and an executing mode. A retimer 715a, 715b in some instances can decode data received on the sublink and re-encode the data that it is to forward downstream on its other sublink. In some cases, the retimer can modify some values in the data it receives, such as when processing and forwarding ordered set data. Additionally, a retimer can potentially support any width option as its maximum width, such as a set of width options defined by a specification such as PCIe.

In some implementations, an interconnect may be defined to support a maximum number of extension devices, such as retimers. For instance, an earlier generation of the interconnect may support a first number of extension devices (e.g., 1 or 2 retimers on a link connecting two end devices), while a later generation of the interconnect (e.g., the high performance interconnect discussed above) may support a larger number of extension device (e.g., 4 or more retimers). To preserve backward compatibility, the later generation of the interconnect may natively support the protocols and training adapted for links where a first number of retimers (or redrivers) are on the link, but may also provide logic for end devices, which support the newer generation of the interconnect, to handle the larger permitted number of retimers.

Figure 8:
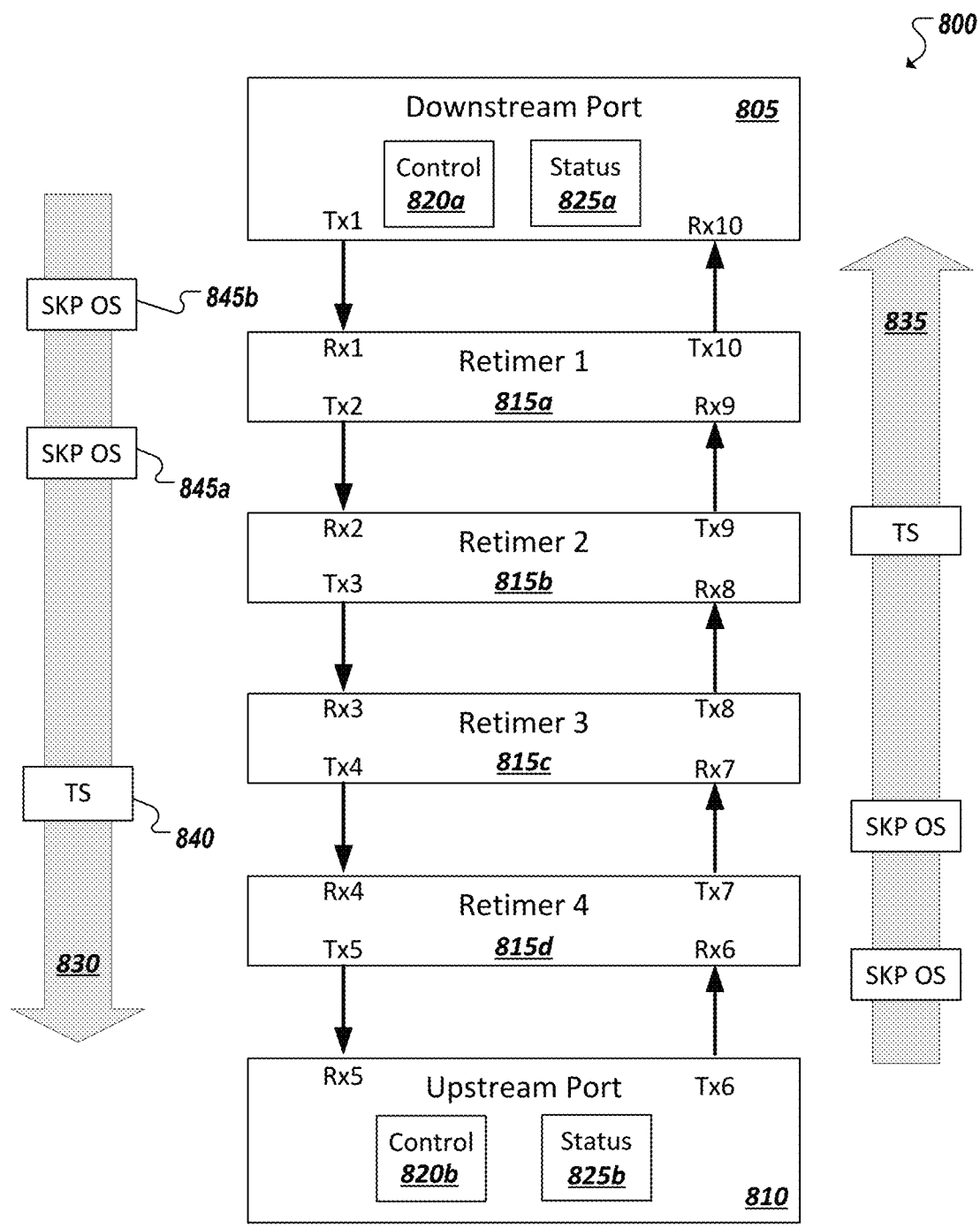
FIG. 8 illustrates a simplified block diagram of an example link including multiple retimer devices.

In one example, up to four retimers may be allowed on a link (e.g., as defined in an interconnect protocol specification). In one example, illustrated by the simplified block diagram 800 of FIG. 8, the interconnect may be based on a PCIe protocol and utilize PCIe-based training sequences (TS) (e.g., 840) and ordered sets (OS) (e.g., 845a-b) when training and configuring the link. In this example, a maximum allowed number of retimer devices (e.g., 815a-d) may be provided on a link that connects the ports 805, 810 of two respective devices connected by the link. The maximum number may be defined according to a next generation interconnect and may be higher than the maximum number allowed by earlier generations of the interconnect. In this example, each of the ports 805, 810 may be configured to support a next generation of the interconnect and may include logic (e.g., implemented in hardware circuitry, firmware, and/or software) (e.g., 820a-b, 825a-b) to support the higher maximum number of the next generation interconnect. As an example, each of the devices may include control logic 820a-b and status logic 825a-b. In one example, status logic 825a-b may be utilized to determine status of a link connecting the corresponding device with a respective link partner device. For instance, the status logic 825a-b may be utilized to determine the number of retimers (e.g., 815a-d) on the link (e.g., from training sequences (e.g., 840) or other training data passed between the devices (e.g., in data 830, 835)). Control logic 820a-b may utilize results determined using status logic to base signaling and link training tasks on the determined status. For instance, control logic 820a-b may modify the sending of ordered sets (e.g., SKP OSes 845a-b) and other link training data that may be consumable by protocol aware extension devices (e.g., some implementations of retimers 815a-d) based on the status of extension devices on the link, including the number of extension devices detected on the link, among other example features.

In some generations of PCIe, a two retimer limit is defined based on multiple considerations such as limitations on the modification of ordered sets used for clock compensation, such as SKP ordered sets (SKP OS). For instance, SKP OSes may be defined such that a retimer is permitted to adjust the length of SKP OSes transmitted in both directions (e.g., in data 830, 835), for instance, to compensate for differences in frequencies between bit rates at two ends of a link. A retimer may adjust the length of a SKP OS by adding or deleting symbols from the SKP OS. In some implementations of PCIe (e.g., when operating with 128b/130b encoding), adjustment of the SKP OS may be defined such that a retimer is permitted to either leave the SKP OS as is, add 4 SKP symbols, or remote 4 SKP symbols. Further, any adjustments performed on the SKP OS may be performed, the same, on all lanes of the link.

A protocol-compliant SKP OS may be defined such that only certain (e.g., a subset of) symbols of the SKP OS may be designated for deletion (e.g., SKP symbols between one or more initial SKP symbols and one or more final SKP symbols in the SKP OS). As a result, the total number of SKP symbols, which may be deleted by retimers on the link, may be limited, such that beyond a threshold number of retimers on the link, insufficient SKP symbols may exist for potential deletion by retimers on the link in connection with each retimer's respective clock frequency compensation efforts. While an interconnect specification may be rewritten to allow smaller blocks of SKP OSes to be deleted (e.g., 2 SKP symbols, rather than the traditional 4 SKP symbols), such changes may interfere with the backward compatibility of such versions of the interconnect, among other example issues.

In one implementation, if a number of retimers are detected on a link that would be too high to support the structure of a specification-defined ordered set, training sequence, or other data (e.g., in that the number of retimers could potentially consume too many symbols within the data), a transmitting agent may elect to modify the manner in which such data is sent (e.g., rather than modifying the defined structure of the data itself). For instance, in the case of SKP OSes, if the number of detected retimers exceeds a threshold number (which the native definition of the SKP OS supports), a device's protocol agent logic (e.g., control logic 820a,b) may increase the sending of the SKP OSes, such as sending two (or more) SKP OSes back-to-back (or consecutively) or by increasing the frequency at which the sending of SKP OSes on the link are scheduled among other examples.

In some implementations, the number of retimers present on a link (e.g., using status logic 825*a,b*) may be determined during or in connection with the training of the link. In one example, training sequences may be sent during training. Training sequences (e.g., 840) may include fields, in which various information may be encoded to be communicated between the link partners (and potentially also extension devices) during the establishing of the link. In one example, a PCIe-based training sequence (e.g., TS2) may be defined, which is to be sent during training of the link. In some instances, an at least partially protocol-aware retimer (e.g., 815*a-d*) may identify a TS2 sent in training data and may modify one or more bits defined in the training sequence 840 to indicate the retimer's presence. In one example, a number of bits (e.g., equal to the maximum number of retimers supported by an interconnect protocol) may be provided. For instance, in a PCIe-based TS2 training sequence, symbol 5 (and/or another symbol) of the TS2 may include a number of bits (e.g., 4 bits) corresponding to the maximum number of supported retimers. As a retimer (e.g., 815*a*) receives the training sequence, the retimer may locate retimer presence bits (which may be set to "0" when generated and originally sent by the downstream transmitting port (e.g., 805)) and may change a "0" retimer presence bi to "1" to indicate its presence. The changed TS may then be forward on by the retimer, either to the upstream port or another intervening retimer (e.g., 815*b*). Should the changed TS be forwarded to the next retimer (e.g., 815*b*) on the link, that retimer (e.g., 815*b*) may likewise locate the retimer presence bits and change the value of one of the "0" bits to "1" to indicate its presence, and so on. When the upstream port 810 receives the TS (after passing through each of the intermediate retimers on the link), the upstream port 810 may read the values of the retimer presence bits and determine (e.g., from the number of retimer presence bits that have been flipped to "1") the number of retimers (e.g., 815*a-d*) on the link. The upstream port 810 may then either loopback this same TS, with the set retimer presence bits, or may generate a fresh TS, which will again be processed by the intermediate retimers (e.g., 815*a-d*) to flip the retimer presence bits, to allow the downstream device 805 (e.g., using control logic 820*a*) to determine the number of retimers (e.g., 815*a-d*) present on the link, among other example implementations. Based on the number of retimers, the link partner devices (e.g., 805, 810) may tune the manner in which other data (e.g., SKP OSes 845*a-b*) are sent over the retimers, among other examples.

Turning to FIGS. 9A-9C, in one example, a legacy generation of an example interconnect protocol (e.g., PCIe Gen 3 or Gen 4), may define a first maximum number of retimers (e.g., 2 retimers). A new generation or version of the interconnect protocol (e.g., PCIe Gen 5), may support a higher number of retimers (e.g., a maximum of 4 (or more) retimers). The maximum number of two retimers, in the previous version of the interconnect, may be based on definition of the ordered set (e.g., SKP OS) used to perform clock compensation tasks. For instance, each retimer may be allowed to delete up to 4 symbols from the SKP OS, leading to an insufficient number of symbols being provided if more than two retimers are present on the link. To preserve backward compatibility, and not alter the definition of the SKP OS, in this example, if it is detected that the number of retimers is beyond the maximum threshold number of retimers supported in a legacy version of the interconnect (upon which the clock compensation OS (e.g., SKP OS) is based), then the link partner devices may modify the manner in which the clock compensation OSes are sent, in order to support the quick configuration of the retimers using these ordered sets.

In the example of FIG. 9A, a simplified block diagram 900*a* is shown illustrating the default manner in which clock compensation ordered sets (e.g., SKP OSes 845*a-b*) may be sent (e.g., when the number of retimers on the link meets or is less than a threshold number (e.g., the maximum number supported by a previous version of an interconnect protocol)). While the clock compensation ordered sets (e.g., 845*a-b*) may be sent to assist with clock compensation tasks, they may be defined to provide various data and be used to perform in a variety of tasks, include clock compensation tasks. In some instances, the clock compensation ordered sets (e.g., 845*a-b*) may be scheduled to be sent at a precise or approximate frequency (e.g., every 360 UI), such as in the example of FIG. 9A. If the end device agents determine that the number of retimers (or other extension devices) present on the link do not exceed a threshold number, than the end device agents (e.g., 805) may maintain the sending of the clock compensation ordered sets (e.g., 845*a-b*) according to a default frequency, with one clock compensation ordered set (e.g., 845*a-b*) being sent according to a defined or approximate period.

Turning to the examples of FIGS. 9B-9C, should end device agents detect a number of retimer devices on a link in excess of a threshold number (e.g., two retimers), the end devices (e.g., 805) may interoperate to cause the number or frequency of clock compensation ordered sets (e.g., 845*a-b*) to be increased to deviate from the default and facilitate the additional retimers. For instance, in the example of FIG. 9B, a simplified block diagram 900*b* is shown illustrating an instance where it has been detected that the number of retimers on the link is in excess of a defined threshold. In this example implementation, in response to detecting that the number of retimers is excess of the threshold, the end device(s) (e.g., 805) may alter the manner in which clock compensation ordered sets are sent across the retimers, by sending two clock compensation ordered sets (e.g., 845*c-d*) consecutively, back-to-back, rather than sending a single clock compensation ordered sets during a defined window (e.g., after 360 UI). This may be done to provide twice as many available symbols (e.g., SKP symbols), which the collective retimers may potentially delete to resolve clock frequency differences, or other clocking or synchronization issues. For instance, in the example of PCIe, the first two retimers may each delete the allowed number of SKP symbols (e.g., 4 symbols, as defined in the PCIe standard) from a first SKP OS 845*c*, leaving no more SKP symbols for deletion by the remaining (e.g., one or more) retimers on the link. By providing back-to-back SKP OSes, the remaining retimers may be provided with additional SKP symbols, which they may delete in connection with clock compensation tasks by these retimers, among other examples.

Turning to FIG. 9C, in an alternative implementation, upon determining that the number of retimers (e.g., 815) on a link are in excess of a threshold, rather than sending clock compensation ordered sets back-to-back (as in the example of FIG. 9B), the link partner agents may instead send the clock compensation ordered sets (e.g., 845*a-b*) more frequently, such as by increasing the frequency of which the clock compensation ordered sets (e.g., 845*a-b*) would ordinarily be sent (as in the example of FIG. 9A), instead sending the clock compensation ordered sets (e.g., 845*e, f, g*) at a higher frequency (e.g., double the frequency (e.g., every 180 UI instead of every 360 UI). In some instances, the end devices (e.g., 805) may increase the sending frequency by a multiple corresponding to the number of retimers in excess of the threshold (e.g., doubling the frequency for up to 4 retimers, where the base frequency is based on a maximum of two retimers, etc.). In such implementations, the first (e.g., two) retimers on the link may utilize a first clock compensation ordered set (e.g., 845e) for symbol deletions, which the next (e.g., two) retimers on the link use the next arriving clock compensation ordered sets (e.g., 845f), and so on, among other example implementations.

In some instances, the inclusion of one or more retimers on a link may result in additional latency on the link. In some implementations, latency increases may be minimizes through various enhancements to the retimer(s). In one example, an improved clocking mechanism may be adopted in retimers to assist in minimizing the latency increase attributable to the retimer. For instance, turning to FIG. 10, a simplified block diagram 1000 is shown illustrating an example retimer 815. In this example, clock crystal accuracy (e.g., ppm) may be adjusted, by utilizing the recovered clock (from incoming data) for the transmission of Tx data after initial training. This may allow latency associated with clock domain crossing, such as from an elastic buffer 1045, to be removed.

Figure 10:
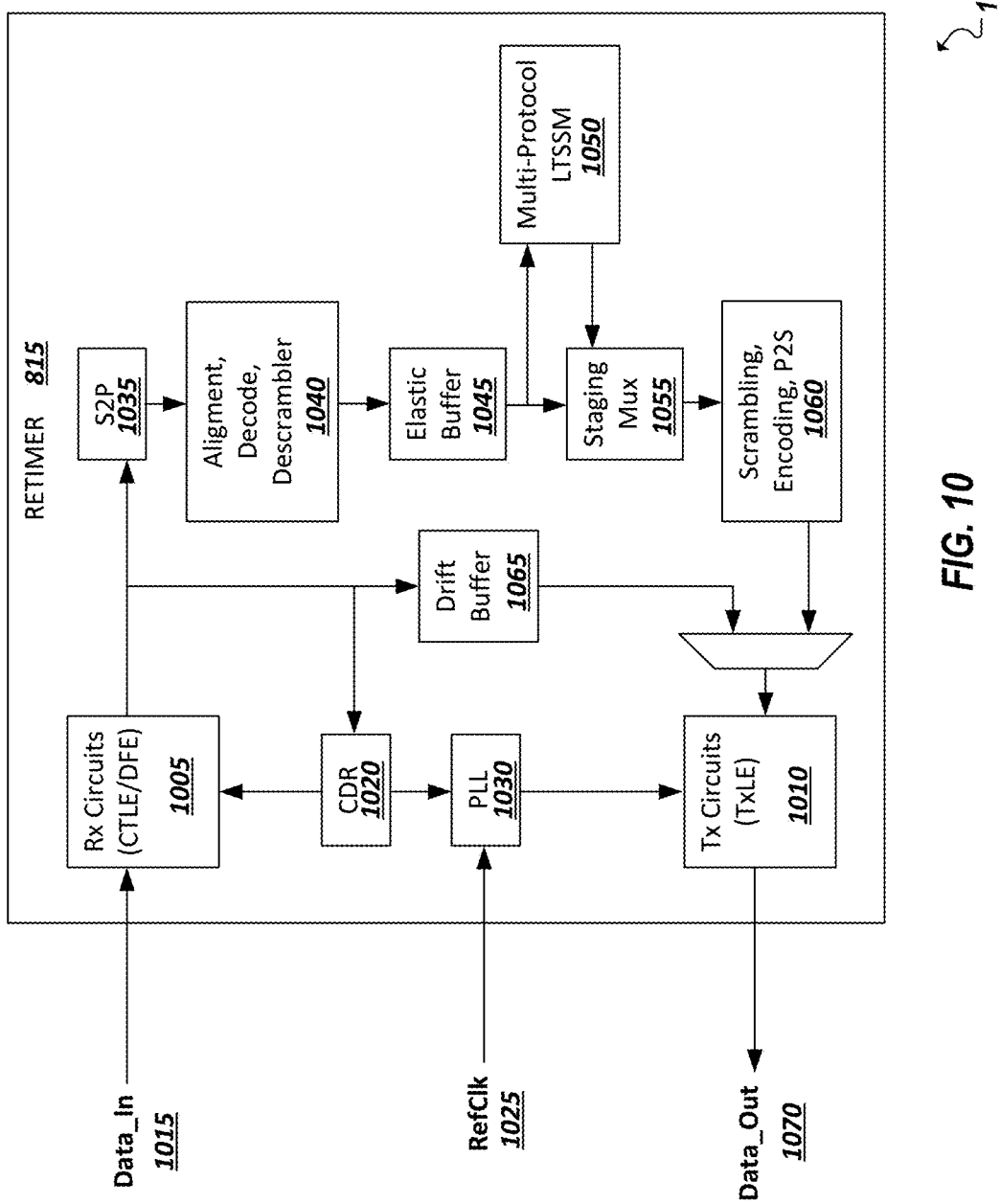
FIG. 10 is a simplified block diagram illustrating an example retimer device.

In the example of FIG. 10, a retimer 815 may be provided with various logic (e.g., implemented in circuitry, firmware, etc.), such as receiving circuits 1005 (e.g., including CTLE and/or DFE circuitry) and transmitter circuits 1010 (e.g., including transmitter linear equalization (TXLE) logic). Receiving circuitry 1005 may receive input data 1015, which may be processed and sent on (as retimer output data 1070) to another device (e.g., the upstream device or another retimer) using transmitter circuitry 1010. Retimer logic may additionally include serial-to-parallel (S2P) translation circuitry 1035, alignment, decoding, and descrambling logic 1040, an elastic buffer 1045, protocol link state machine logic 1050 (e.g., supporting one or more multiple different protocols), staging multiplexer 1055, scrambling, encoding, and parallel-to-serial (P2S) logic, among other example components.

Continuing with the example of FIG. 10, in addition to input data 1015, the retimer may receive a reference clock signal 1025. The retimer 815 may be provided with phase lock loop (PLL) circuitry to provide a clock for use by one or more components of the retimer 815, including the transmitter circuitry 1010. Clock and data recovery (CDR) circuitry 1020 may be provided which may extract a clock signal, corresponding to a downstream device, from the input data 1015. In one implementation, during link training, the transmitter circuitry 1010 may accept a clock signal generated by the PLL circuitry 1030 from a reference clock 1025. Following the completion of link training, data (e.g., 1015) may be sent on the link, and switching logic may be provided to cause the PLL 1030 to accept the recovered clock from CDR circuitry 1020 as its reference, rather than the reference clock 1025. In some implementations, as a CDR clock may have comparatively higher jitter, a clean-up PLL may also be added, which uses the CDR clock (or divided down CDR clock). Additionally, a drift buffer 1065 may be provided, for instance, to handle the clock domain crossing (e.g., when the two different clocks have drift relative to each other), among other example components, features, and implementations.

Figure 11A:
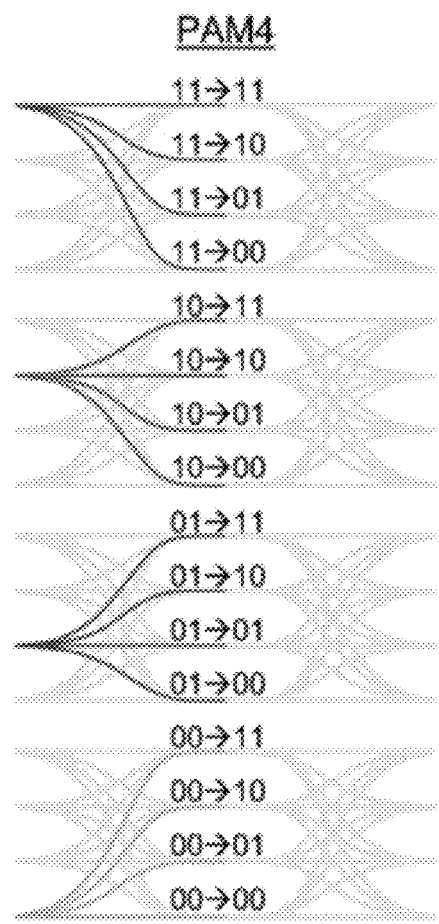
Figure 11B:
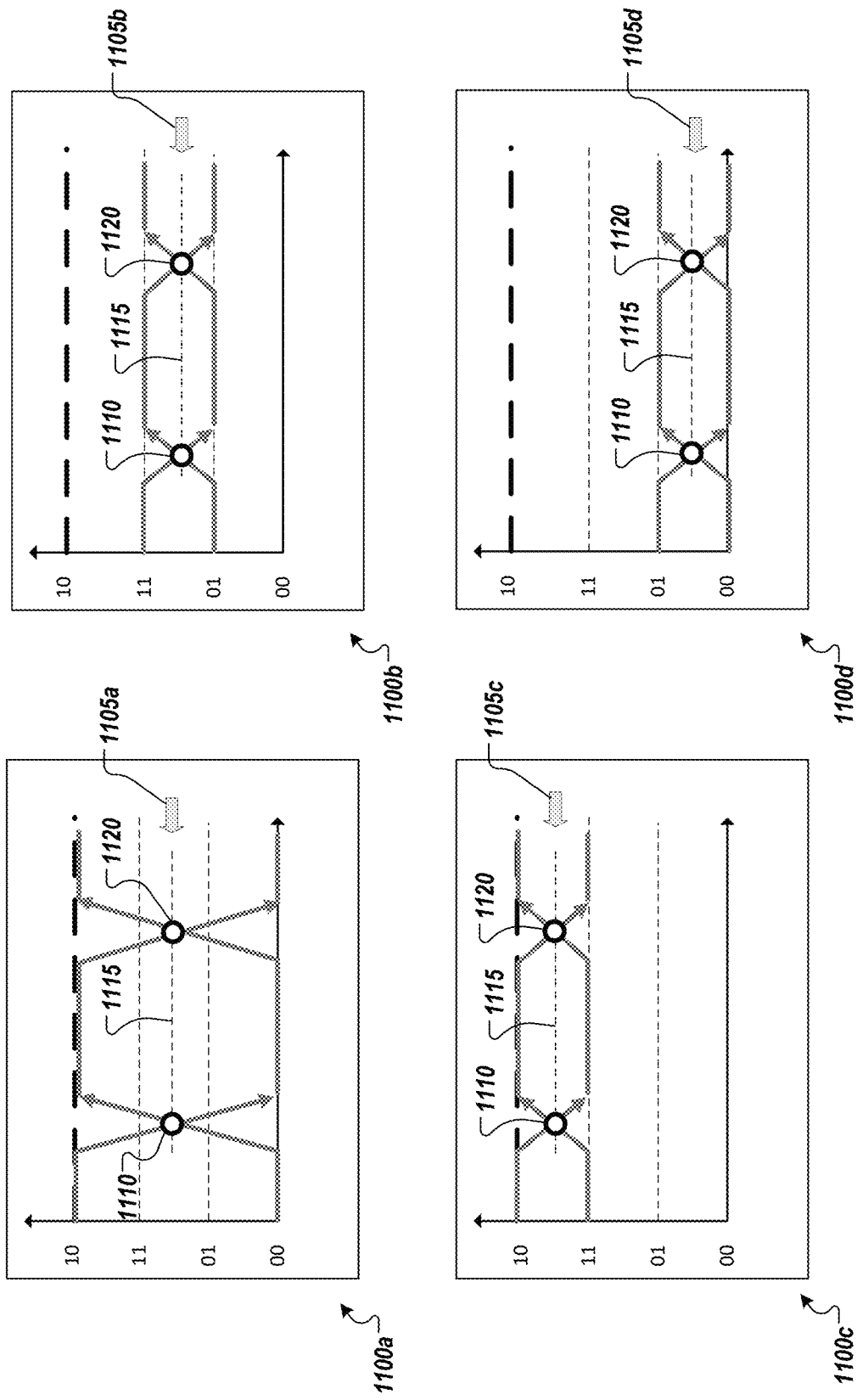

FIGS. 11A-11C illustrate aspects of a pulse amplitude modulation (PAM)-based implementation of an example high performance interconnect. As shown in FIG. 11A, in an implementation of PAM4, there may be 3 transitions per level, with a total of 12 different transitions. FIG. 11B shows graphs 1100a-d showing example PAM4 data and edge sampling points (e.g., 1110, 1115, 1120) based on corresponding reference voltages 1105a-d. FIG. 11C shows another graph 1100e, illustrating a grouping of edge transitions 1150 that should be sensed, corresponding to the detection of the middle (e.g., Vref), top, and bottom edge transitions. Other edges (transitions) (e.g., 1155) may be ignored. In some PAM-based implementations, data pattern filtering CDR may be provided to remove coding related jitter. For instance, as represented in the example of FIGS. 11A-11C, symmetrical transitions may be selected to remove the extra jitter arising from PAM-based (e.g., PAM4) coding, allowing such a PAM-based implementation to achieve performance similar to NRZ-based implementations, among other example implementations.

While some of the examples above have made specific reference to certain particular interconnect technologies and specifications, it should be appreciated that the principles discussed herein may be applied to a variety of different interconnects. Further, it should be appreciated that the examples discussed herein are presented as non-limiting examples provided for the purpose of illustrating more generalized solutions, features, and systems. Indeed, a variety of alternative examples and implementations may be realized that utilize and do not depart from the principles and features discussed herein.

FIGS. 12A-12B are flowcharts 1200a-b illustrating example techniques utilizing an example high performance interconnect. For instance, in example FIG. 12A, training sequences may be received 1205 by a particular end device on a link that connects the particular end device with another device and includes a number of retimer devices positioned between the two end devices to extend the physical length of the link. From the training sequences, the particular end device may identify 1210 the number of retimers on the link. The particular end device may determine 1215 whether the identified number of retimer is higher than a particular threshold. For instance, the threshold may correspond to a maximum number of retimers allowed under a previous generation of an interconnect protocol. Based on determining 1215 that the present number of retimers exceeds the threshold number, protocol logic of the particular end device may schedule and send clock compensation ordered sets (e.g., PCIe SKP OSes) on the link for use by the number of retimers in performing clock compensation tasks. In some instances, these tasks may involve adding or removing symbols to the clock compensation ordered sets. In some examples, in response to determining 1215 that the number of retimers exceeds the threshold number, the particular end device may send 1220 multiple clock compensation ordered sets consecutively, rather than just sending a single clock compensation ordered set at a time. In another example, the particular end device, in response to determining 1215 that the number of retimers exceeds the threshold number, may increase the frequency by which the clock compensation ordered sets are sent relative to the frequency of clock compensation ordered sets that would be applied if the number of retimers on the link were below (or at) the threshold, among other examples.

Turning to FIG. 12B, link training may begin 1225 and steps and training data may be used to determine an operating speed for the link. Two or more alternative speeds may be supported on the link (e.g., in accordance with a particular interconnect protocol). During the link training one or both of the link partner end devices may determine 1230 first whether each of the link partners supports a higher (e.g., 32 GT/s) of the two or more alternative speeds. If not, the link partners may determine that a lower operating speed (e.g., 25 Gt/s) is to be used (at 1250). If both end devices indicate that they support the higher speed, the end devices may communicate to determine whether the channel loss of the link is below a threshold value when operating at the higher speed. The channel loss threshold value, in some implementations, may defined in a specification of the particular interconnect protocol. If it is determined 1235 (e.g., through communication between the end devices using link training sequences) that the link can operate at the higher speed, the end devices may communicate to configure the link to operate 1245 at the higher speed. If it is determined (at 1235) that the channel loss is higher than the threshold value, it can be determined 1240 whether forward error correction (FEC) is available for use at either or both of the end devices to reduce the channel loss and thereby raise the acceptable channel loss threshold for operation at the higher speed. If FEC (or other features) are not available to address the higher channel loss at the higher speed, the end devices may configure the link to operate 1250 at the lower operating speed. On the other hand, if FEC is provided for the link, the end devices may configure the link to operate 1245 at the higher operating speed, among other example considerations and link training activities.

Note that the apparatus', methods', and systems described above may be implemented in any electronic device or system as aforementioned. As specific illustrations, the figures below provide exemplary systems for utilizing the invention as described herein. As the systems below are described in more detail, a number of different interconnects are disclosed, described, and revisited from the discussion above. And as is readily apparent, the advances described above may be applied to any of those interconnects, fabrics, or architectures.

Figure 13:
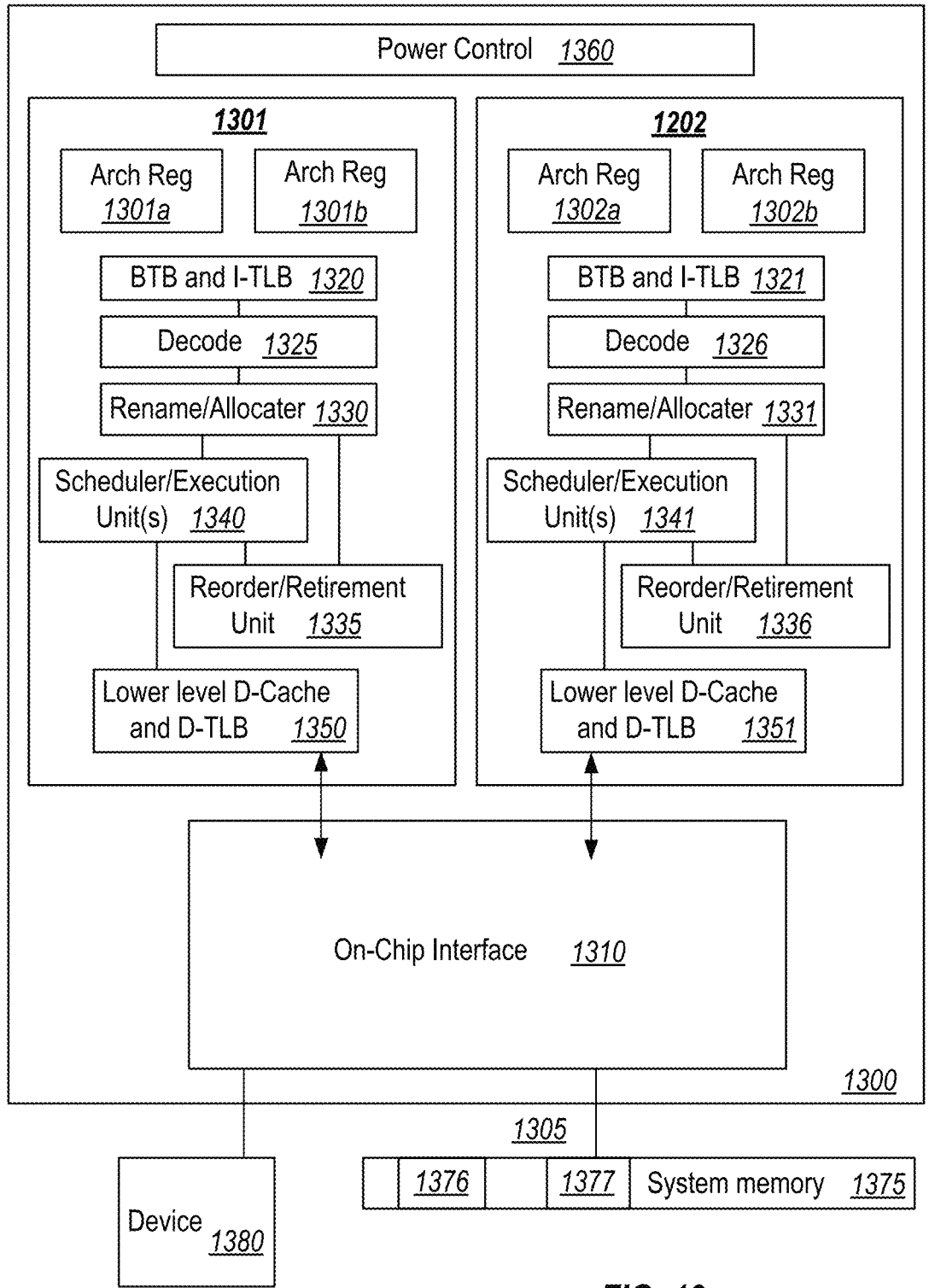
FIG. 13 illustrates an embodiment of a block diagram for a computing system including a multicore processor.

Referring to FIG. 13, an embodiment of a block diagram for a computing system including a multicore processor is depicted. Processor 1300 includes any processor or processing device, such as a microprocessor, an embedded processor, a digital signal processor (DSP), a network processor, a handheld processor, an application processor, a co-processor, a system on a chip (SOC), or other device to execute code. Processor 1300, in one embodiment, includes at least two cores—core 1301 and 1302, which may include asymmetric cores or symmetric cores (the illustrated embodiment). However, processor 1300 may include any number of processing elements that may be symmetric or asymmetric.

In one embodiment, a processing element refers to hardware or logic to support a software thread. Examples of hardware processing elements include: a thread unit, a thread slot, a thread, a process unit, a context, a context unit, a logical processor, a hardware thread, a core, and/or any other element, which is capable of holding a state for a processor, such as an execution state or architectural state. In other words, a processing element, in one embodiment, refers to any hardware capable of being independently associated with code, such as a software thread, operating system, application, or other code. A physical processor (or processor socket) typically refers to an integrated circuit, which potentially includes any number of other processing elements, such as cores or hardware threads.

A core often refers to logic located on an integrated circuit capable of maintaining an independent architectural state, wherein each independently maintained architectural state is associated with at least some dedicated execution resources. In contrast to cores, a hardware thread typically refers to any logic located on an integrated circuit capable of maintaining an independent architectural state, wherein the independently maintained architectural states share access to execution resources. As can be seen, when certain resources are shared and others are dedicated to an architectural state, the line between the nomenclature of a hardware thread and core overlaps. Yet often, a core and a hardware thread are viewed by an operating system as individual logical processors, where the operating system is able to individually schedule operations on each logical processor.

Physical processor 1200, as illustrated in FIG. 13, includes two cores—core 1301 and 1302. Here, core 1301 and 1302 are considered symmetric cores, i.e. cores with the same configurations, functional units, and/or logic. In another embodiment, core 1301 includes an out-of-order processor core, while core 1302 includes an in-order processor core. However, cores 1301 and 1302 may be individually selected from any type of core, such as a native core, a software managed core, a core adapted to execute a native Instruction Set Architecture (ISA), a core adapted to execute a translated Instruction Set Architecture (ISA), a co-designed core, or other known core. In a heterogeneous core environment (i.e. asymmetric cores), some form of translation, such as a binary translation, may be utilized to schedule or execute code on one or both cores. Yet to further the discussion, the functional units illustrated in core 1301 are described in further detail below, as the units in core 1302 operate in a similar manner in the depicted embodiment.

As depicted, core 1301 includes two hardware threads 1301a and 1301b, which may also be referred to as hardware thread slots 1301a and 1301b. Therefore, software entities, such as an operating system, in one embodiment potentially view processor 1300 as four separate processors, i.e., four logical processors or processing elements capable of executing four software threads concurrently. As alluded to above, a first thread is associated with architecture state registers 1301a, a second thread is associated with architecture state registers 1301b, a third thread may be associated with architecture state registers 1302a, and a fourth thread may be associated with architecture state registers 1302b. Here, each of the architecture state registers (1301a, 1301b, 1302a, and 1302b) may be referred to as processing elements, thread slots, or thread units, as described above. As illustrated, architecture state registers 1301a are replicated in architecture state registers 1301b, so individual architecture states/contexts are capable of being stored for logical processor 1301a and logical processor 1301b. In core 1301, other smaller resources, such as instruction pointers and renaming logic in allocator and renamer block 1330 may also be replicated for threads 1301a and 1301b. Some resources, such as re-order buffers in reorder/retirement unit 1335, ILTB 1320, load/store buffers, and queues may be shared through partitioning. Other resources, such as general purpose internal registers, page-table base register(s), low-level data-cache and data-TLB 1315, execution unit(s) 1340, and portions of out-of-order unit 1335 are potentially fully shared.

Processor 1300 often includes other resources, which may be fully shared, shared through partitioning, or dedicated by/to processing elements. In FIG. 13, an embodiment of a purely exemplary processor with illustrative logical units/resources of a processor is illustrated. Note that a processor may include, or omit, any of these functional units, as well as include any other known functional units, logic, or firmware not depicted. As illustrated, core 1301 includes a simplified, representative out-of-order (OOO) processor core. But an in-order processor may be utilized in different embodiments. The OOO core includes a branch target buffer 1320 to predict branches to be executed/taken and an instruction-translation buffer (I-TLB) 1320 to store address translation entries for instructions.

Core 1301 further includes decode module 1325 coupled to fetch unit 1320 to decode fetched elements. Fetch logic, in one embodiment, includes individual sequencers associated with thread slots 1301a, 1301b, respectively. Usually core 1301 is associated with a first ISA, which defines/specifies instructions executable on processor 1300. Often machine code instructions that are part of the first ISA include a portion of the instruction (referred to as an opcode), which references/specifies an instruction or operation to be performed. Decode logic 1325 includes circuitry that recognizes these instructions from their opcodes and passes the decoded instructions on in the pipeline for processing as defined by the first ISA. For example, as discussed in more detail below decoders 1325, in one embodiment, include logic designed or adapted to recognize specific instructions, such as transactional instruction. As a result of the recognition by decoders 1325, the architecture or core 1301 takes specific, predefined actions to perform tasks associated with the appropriate instruction. It is important to note that any of the tasks, blocks, operations, and methods described herein may be performed in response to a single or multiple instructions; some of which may be new or old instructions. Note decoders 1326, in one embodiment, recognize the same ISA (or a subset thereof). Alternatively, in a heterogeneous core environment, decoders 1326 recognize a second ISA (either a subset of the first ISA or a distinct ISA).

In one example, allocator and renamer block 1330 includes an allocator to reserve resources, such as register files to store instruction processing results. However, threads 1301a and 1301b are potentially capable of out-of-order execution, where allocator and renamer block 1330 also reserves other resources, such as reorder buffers to track instruction results. Unit 1330 may also include a register renamer to rename program/instruction reference registers to other registers internal to processor 1300. Reorder/retirement unit 1335 includes components, such as the reorder buffers mentioned above, load buffers, and store buffers, to support out-of-order execution and later in-order retirement of instructions executed out-of-order.

Scheduler and execution unit(s) block 1340, in one embodiment, includes a scheduler unit to schedule instructions/operation on execution units. For example, a floating point instruction is scheduled on a port of an execution unit that has an available floating point execution unit. Register files associated with the execution units are also included to store information instruction processing results. Exemplary execution units include a floating point execution unit, an integer execution unit, a jump execution unit, a load execution unit, a store execution unit, and other known execution units.

Lower level data cache and data translation buffer (D-TLB) 1350 are coupled to execution unit(s) 1340. The data cache is to store recently used/operated on elements, such as data operands, which are potentially held in memory coherency states. The D-TLB is to store recent virtual/linear to physical address translations. As a specific example, a processor may include a page table structure to break physical memory into a plurality of virtual pages.

Here, cores 1301 and 1302 share access to higher-level or further-out cache, such as a second level cache associated with on-chip interface 1310. Note that higher-level or further-out refers to cache levels increasing or getting further way from the execution unit(s). In one embodiment, higher-level cache is a last-level data cache—last cache in the memory hierarchy on processor 1300—such as a second or third level data cache. However, higher level cache is not so limited, as it may be associated with or include an instruction cache. A trace cache—a type of instruction cache—instead may be coupled after decoder 1325 to store recently decoded traces. Here, an instruction potentially refers to a macro-instruction (i.e. a general instruction recognized by the decoders), which may decode into a number of micro-instructions (micro-operations).

In the depicted configuration, processor 1300 also includes on-chip interface module 1310. Historically, a memory controller, which is described in more detail below, has been included in a computing system external to processor 1300. In this scenario, on-chip interface 1310 is to communicate with devices external to processor 1300, such as system memory 1375, a chipset (often including a memory controller hub to connect to memory 1375 and an I/O controller hub to connect peripheral devices), a memory controller hub, a northbridge, or other integrated circuit. And in this scenario, bus 1305 may include any known interconnect, such as multi-drop bus, a point-to-point interconnect, a serial interconnect, a parallel bus, a coherent (e.g. cache coherent) bus, a layered protocol architecture, a differential bus, and a GTL bus.

Memory 1375 may be dedicated to processor 1300 or shared with other devices in a system. Common examples of types of memory 1375 include DRAM, SRAM, non-volatile memory (NV memory), and other known storage devices. Note that device 1380 may include a graphic accelerator, processor or card coupled to a memory controller hub, data storage coupled to an I/O controller hub, a wireless transceiver, a flash device, an audio controller, a network controller, or other known device.

Recently however, as more logic and devices are being integrated on a single die, such as SOC, each of these devices may be incorporated on processor 1300. For example in one embodiment, a memory controller hub is on the same package and/or die with processor 1300. Here, a portion of the core (an on-core portion) 1310 includes one or more controller(s) for interfacing with other devices such as memory 1375 or a graphics device 1380. The configuration including an interconnect and controllers for interfacing with such devices is often referred to as an on-core (or un-core configuration). As an example, on-chip interface 1310 includes a ring interconnect for on-chip communication and a high-speed serial point-to-point link 1305 for off-chip communication. Yet, in the SOC environment, even more devices, such as the network interface, co-processors, memory 1375, graphics processor 1380, and any other known computer devices/interface may be integrated on a single die or integrated circuit to provide small form factor with high functionality and low power consumption.

In one embodiment, processor 1300 is capable of executing a compiler, optimization, and/or translator code 1377 to compile, translate, and/or optimize application code 1376 to support the apparatus and methods described herein or to interface therewith. A compiler often includes a program or set of programs to translate source text/code into target text/code. Usually, compilation of program/application code with a compiler is done in multiple phases and passes to transform hi-level programming language code into low-level machine or assembly language code. Yet, single pass compilers may still be utilized for simple compilation. A compiler may utilize any known compilation techniques and perform any known compiler operations, such as lexical analysis, preprocessing, parsing, semantic analysis, code generation, code transformation, and code optimization.

Larger compilers often include multiple phases, but most often these phases are included within two general phases: (1) a front-end, i.e. generally where syntactic processing, semantic processing, and some transformation/optimization may take place, and (2) a back-end, i.e. generally where analysis, transformations, optimizations, and code generation takes place. Some compilers refer to a middle, which illustrates the blurring of delineation between a front-end and back end of a compiler. As a result, reference to insertion, association, generation, or other operation of a compiler may take place in any of the aforementioned phases or passes, as well as any other known phases or passes of a compiler. As an illustrative example, a compiler potentially inserts operations, calls, functions, etc. in one or more phases of compilation, such as insertion of calls/operations in a front-end phase of compilation and then transformation of the calls/operations into lower-level code during a transformation phase. Note that during dynamic compilation, compiler code or dynamic optimization code may insert such operations/calls, as well as optimize the code for execution during runtime. As a specific illustrative example, binary code (already compiled code) may be dynamically optimized during runtime. Here, the program code may include the dynamic optimization code, the binary code, or a combination thereof.

Similar to a compiler, a translator, such as a binary translator, translates code either statically or dynamically to optimize and/or translate code. Therefore, reference to execution of code, application code, program code, or other software environment may refer to: (1) execution of a compiler program(s), optimization code optimizer, or translator either dynamically or statically, to compile program code, to maintain software structures, to perform other operations, to optimize code, or to translate code; (2) execution of main program code including operations/calls, such as application code that has been optimized/compiled; (3) execution of other program code, such as libraries, associated with the main program code to maintain software structures, to perform other software related operations, or to optimize code; or (4) a combination thereof.

Figure 14:
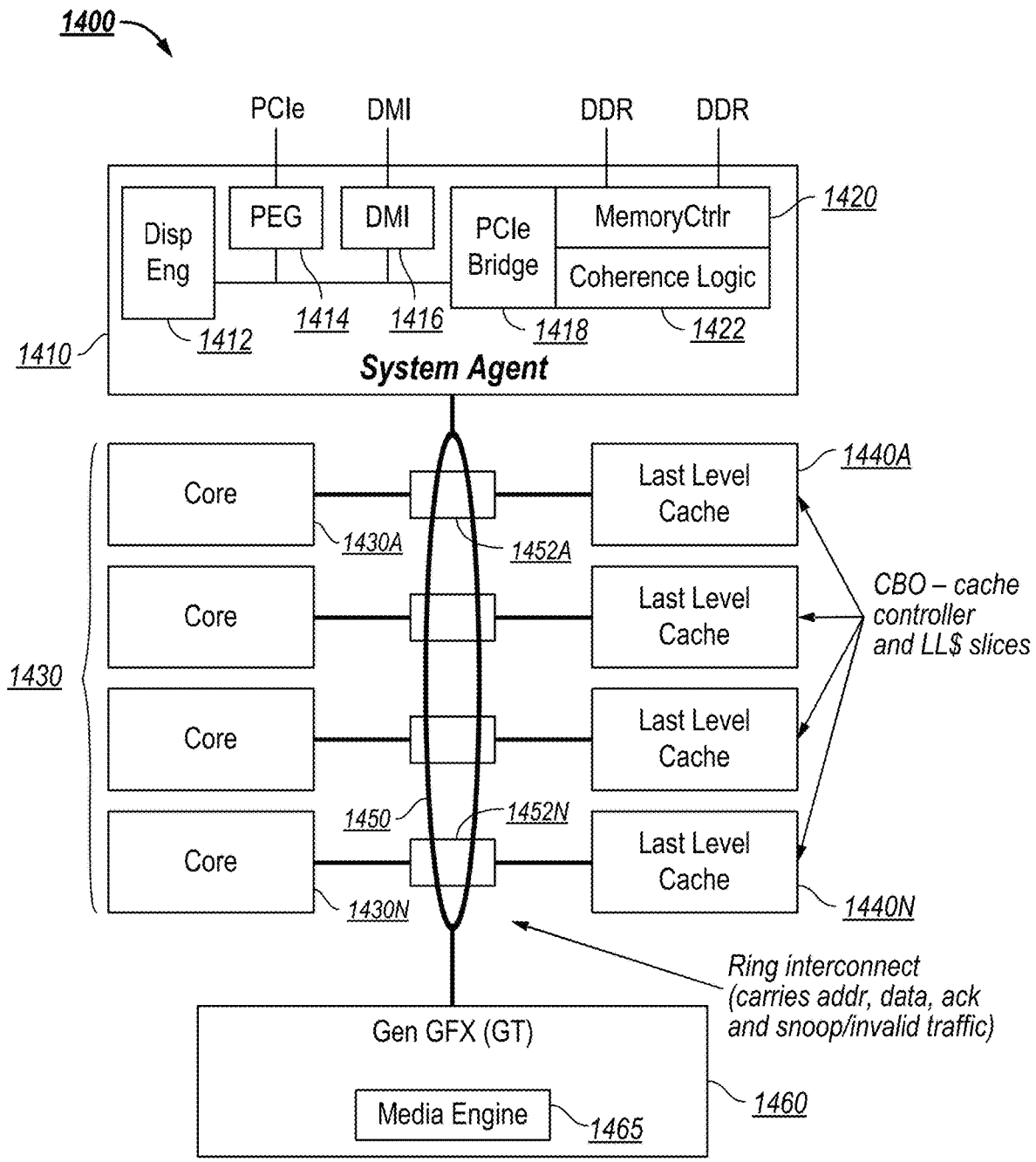
FIG. 14 illustrates another embodiment of a block diagram for a computing system including a multicore processor.

Referring now to FIG. 14, shown is a block diagram of an embodiment of a multicore processor. As shown in the embodiment of FIG. 14, processor 1400 includes multiple domains. Specifically, a core domain 1430 includes a plurality of cores 1430A-1430N, a graphics domain 1460 includes one or more graphics engines having a media engine 1465, and a system agent domain 1410.

In various embodiments, system agent domain 1410 handles power control events and power management, such that individual units of domains 1430 and 1460 (e.g. cores and/or graphics engines) are independently controllable to dynamically operate at an appropriate power mode/level (e.g. active, turbo, sleep, hibernate, deep sleep, or other Advanced Configuration Power Interface like state) in light of the activity (or inactivity) occurring in the given unit. Each of domains 1430 and 1460 may operate at different voltage and/or power, and furthermore the individual units within the domains each potentially operate at an independent frequency and voltage. Note that while only shown with three domains, understand the scope of the present invention is not limited in this regard and additional domains may be present in other embodiments.

As shown, each core 1430 further includes low level caches in addition to various execution units and additional processing elements. Here, the various cores are coupled to each other and to a shared cache memory that is formed of a plurality of units or slices of a last level cache (LLC) 1440A-1440N; these LLCs often include storage and cache controller functionality and are shared amongst the cores, as well as potentially among the graphics engine too.

As seen, a ring interconnect 1450 couples the cores together, and provides interconnection between the core domain 1430, graphics domain 1460 and system agent circuitry 1410, via a plurality of ring stops 1452A-1452N, each at a coupling between a core and LLC slice. As seen in FIG. 14, interconnect 1450 is used to carry various information, including address information, data information, acknowledgement information, and snoop/invalid information. Although a ring interconnect is illustrated, any known on-die interconnect or fabric may be utilized. As an illustrative example, some of the fabrics discussed above (e.g. another on-die interconnect, On-chip System Fabric (OSF), an Advanced Microcontroller Bus Architecture (AMBA) interconnect, a multi-dimensional mesh fabric, or other known interconnect architecture) may be utilized in a similar fashion.

As further depicted, system agent domain 1410 includes display engine 1412 which is to provide control of and an interface to an associated display. System agent domain 1410 may include other units, such as: an integrated memory controller 1420 that provides for an interface to a system memory (e.g., a DRAM implemented with multiple DIMMs; coherence logic 1422 to perform memory coherence operations. Multiple interfaces may be present to enable interconnection between the processor and other circuitry. For example, in one embodiment at least one direct media interface (DMI) 1416 interface is provided as well as one or more PCIe™ interfaces 1414. The display engine and these interfaces typically couple to memory via a PCIe™ bridge 1418. Still further, to provide for communications between other agents, such as additional processors or other circuitry, one or more other interfaces may be provided.

Figure 15:
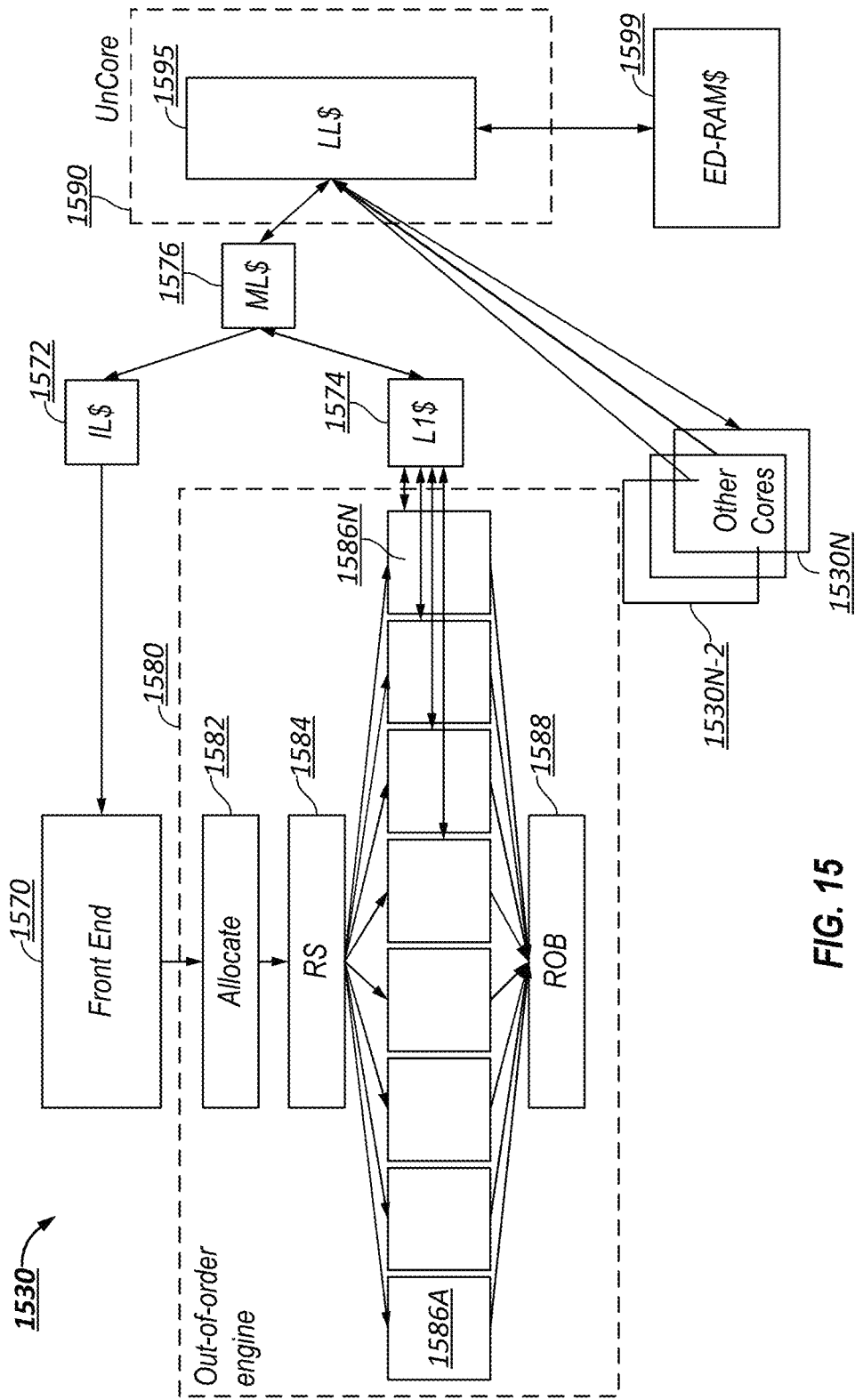
FIG. 15 illustrates an embodiment of a block diagram for a processor.

Referring now to FIG. 15, shown is a block diagram of a representative core; specifically, logical blocks of a back-end of a core, such as core 1430 from FIG. 14. In general, the structure shown in FIG. 15 includes an out-of-order processor that has a front end unit 1570 used to fetch incoming instructions, perform various processing (e.g. caching, decoding, branch predicting, etc.) and passing instructions/operations along to an out-of-order (OOO) engine 1580. OOO engine 1580 performs further processing on decoded instructions.

Specifically in the embodiment of FIG. 15, out-of-order engine 1580 includes an allocate unit 1582 to receive decoded instructions, which may be in the form of one or more micro-instructions or uops, from front end unit 1570, and allocate them to appropriate resources such as registers and so forth. Next, the instructions are provided to a reservation station 1584, which reserves resources and schedules them for execution on one of a plurality of execution units 1586A-1486N. Various types of execution units may be present, including, for example, arithmetic logic units (ALUs), load and store units, vector processing units (VPUs), floating point execution units, among others. Results from these different execution units are provided to a reorder buffer (ROB) 1588, which take unordered results and return them to correct program order.

Still referring to FIG. 15, note that both front end unit 1570 and out-of-order engine 1580 are coupled to different levels of a memory hierarchy. Specifically shown is an instruction level cache 1572, that in turn couples to a mid-level cache 1576, that in turn couples to a last level cache 1595. In one embodiment, last level cache 1595 is implemented in an on-chip (sometimes referred to as uncore) unit 1590. As an example, unit 1590 is similar to system agent 1310 of FIG. 13. As discussed above, uncore 1590 communicates with system memory 1599, which, in the illustrated embodiment, is implemented via ED RAM. Note also that the various execution units 1586 within out-of-order engine 1580 are in communication with a first level cache 1574 that also is in communication with mid-level cache 1576. Note also that additional cores 1530N-2-1530N can couple to LLC 1595. Although shown at this high level in the embodiment of FIG. 15, understand that various alterations and additional components may be present.

Figure 16:
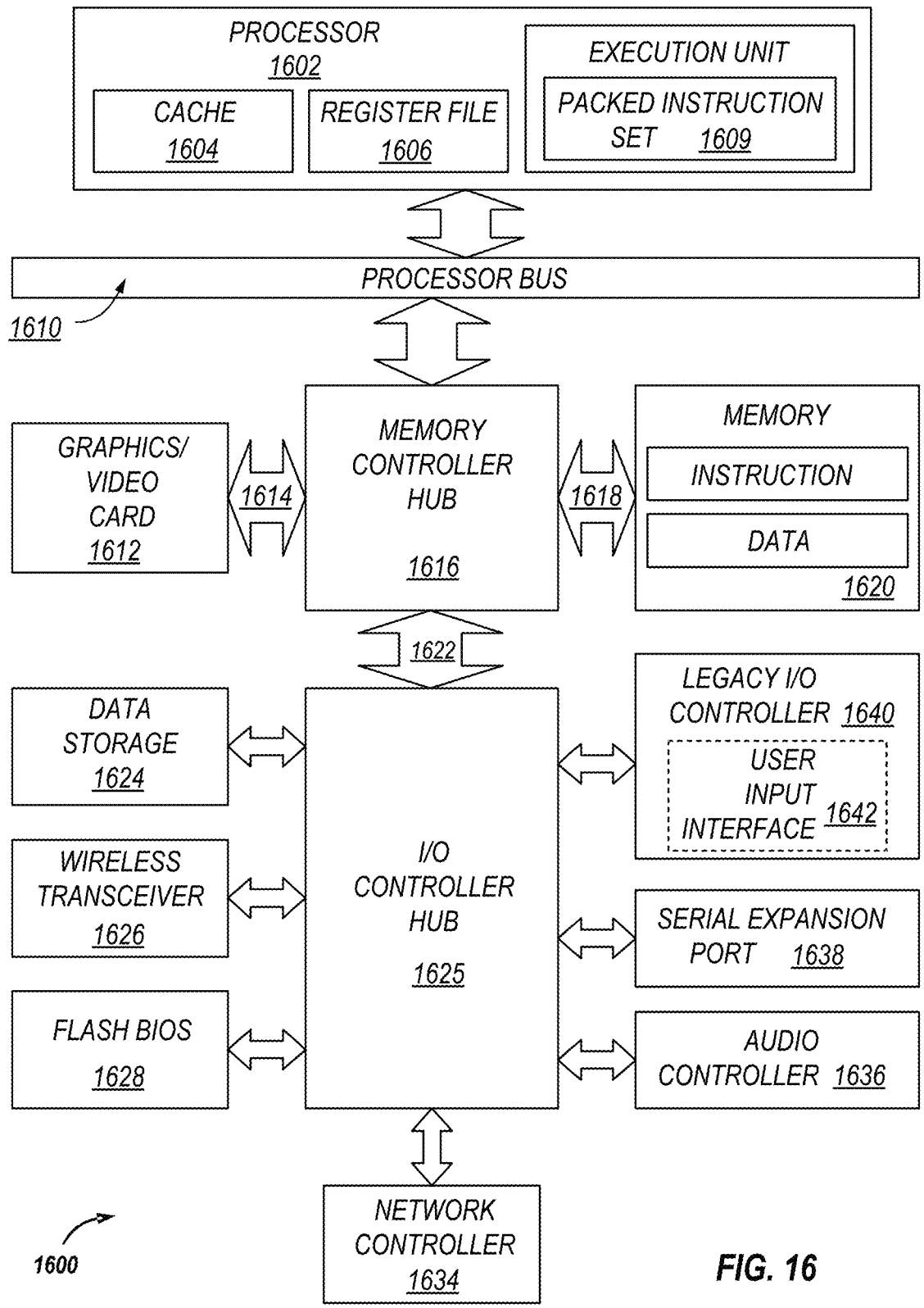
FIG. 16 illustrates another embodiment of a block diagram for a computing system including a processor.

Turning to FIG. 16, a block diagram of an exemplary computer system formed with a processor that includes execution units to execute an instruction, where one or more of the interconnects implement one or more features in accordance with one embodiment of the present invention is illustrated. System 1600 includes a component, such as a processor 1602 to employ execution units including logic to perform algorithms for process data, in accordance with the present invention, such as in the embodiment described herein. System 1600 is representative of processing systems based on the PENTIUM III™, PENTIUM 4™, Xeon™, Itanium, XScale™ and/or StrongARM™ microprocessors, although other systems (including PCs having other microprocessors, engineering workstations, set-top boxes and the like) may also be used. In one embodiment, sample system 1600 executes a version of the WINDOWS™ operating system available from Microsoft Corporation of Redmond, Wash., although other operating systems (UNIX and Linux for example), embedded software, and/or graphical user interfaces, may also be used. Thus, embodiments of the present invention are not limited to any specific combination of hardware circuitry and software.

Embodiments are not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

In this illustrated embodiment, processor 1602 includes one or more execution units 1608 to implement an algorithm that is to perform at least one instruction. One embodiment may be described in the context of a single processor desktop or server system, but alternative embodiments may be included in a multiprocessor system. System 1600 is an example of a 'hub' system architecture. The computer system 1600 includes a processor 1602 to process data signals. The processor 1602, as one illustrative example, includes a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 1602 is coupled to a processor bus 1610 that transmits data signals between the processor 1602 and other components in the system 1600. The elements of system 1600 (e.g. graphics accelerator 1612, memory controller hub 1616, memory 1620, I/O controller hub 1625, wireless transceiver 1626, Flash BIOS 1628, Network controller 1634, Audio controller 1636, Serial expansion port 1638, I/O controller 1640, etc.) perform their conventional functions that are well known to those familiar with the art.

In one embodiment, the processor 1602 includes a Level 1 (L1) internal cache memory 1604. Depending on the architecture, the processor 1602 may have a single internal cache or multiple levels of internal caches. Other embodiments include a combination of both internal and external caches depending on the particular implementation and needs. Register file 1606 is to store different types of data in various registers including integer registers, floating point registers, vector registers, banked registers, shadow registers, checkpoint registers, status registers, and instruction pointer register.

Execution unit 1608, including logic to perform integer and floating point operations, also resides in the processor 1602. The processor 1602, in one embodiment, includes a microcode (ucode) ROM to store microcode, which when executed, is to perform algorithms for certain macroinstructions or handle complex scenarios. Here, microcode is potentially updateable to handle logic bugs/fixes for processor 1602. For one embodiment, execution unit 1608 includes logic to handle a packed instruction set 1609. By including the packed instruction set 1609 in the instruction set of a general-purpose processor 1602, along with associated circuitry to execute the instructions, the operations used by many multimedia applications may be performed using packed data in a general-purpose processor 1602. Thus, many multimedia applications are accelerated and executed more efficiently by using the full width of a processor's data bus for performing operations on packed data. This potentially eliminates the need to transfer smaller units of data across the processor's data bus to perform one or more operations, one data element at a time.

Alternate embodiments of an execution unit 1608 may also be used in micro controllers, embedded processors, graphics devices, DSPs, and other types of logic circuits. System 1600 includes a memory 1620. Memory 1620 includes a dynamic random access memory (DRAM) device, a static random access memory (SRAM) device, flash memory device, or other memory device. Memory 1620 stores instructions and/or data represented by data signals that are to be executed by the processor 1602.

Note that any of the aforementioned features or aspects of the invention may be utilized on one or more interconnect illustrated in FIG. 16. For example, an on-die interconnect (ODI), which is not shown, for coupling internal units of processor 1602 implements one or more aspects of the invention described above. Or the invention is associated with a processor bus 1610 (e.g. other known high performance computing interconnect), a high bandwidth memory path 1618 to memory 1620, a point-to-point link to graphics accelerator 1612 (e.g. a Peripheral Component Interconnect express (PCIe) compliant fabric), a controller hub interconnect 1622, an I/O or other interconnect (e.g. USB, PCI, PCIe) for coupling the other illustrated components. Some examples of such components include the audio controller 1636, firmware hub (flash BIOS) 1628, wireless transceiver 1626, data storage 1624, legacy I/O controller 1610 containing user input and keyboard interfaces 1642, a serial expansion port 1638 such as Universal Serial Bus (USB), and a network controller 1634. The data storage device 1624 can comprise a hard disk drive, a floppy disk drive, a CD-ROM device, a flash memory device, or other mass storage device.

Figure 17:
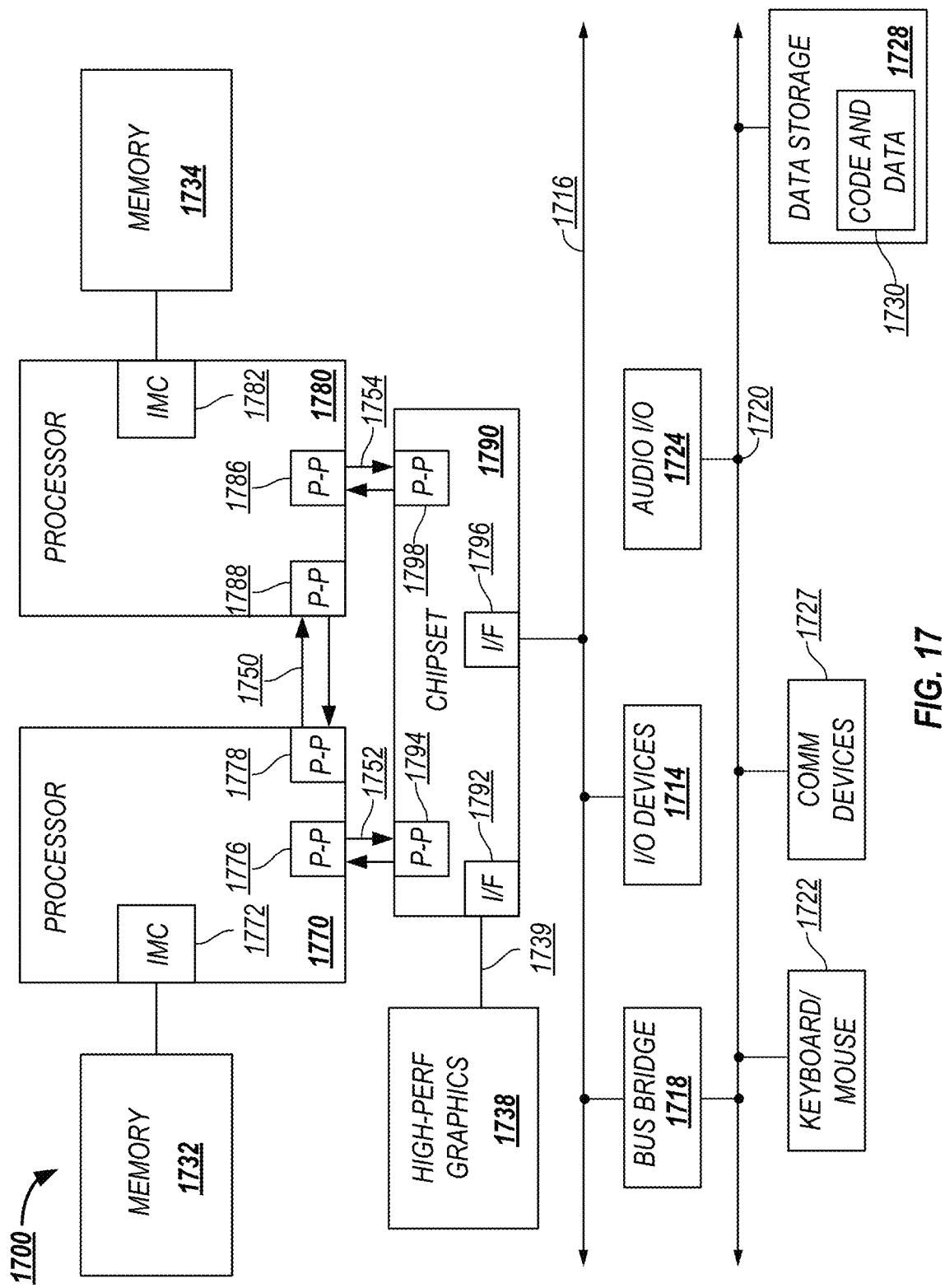
FIG. 17 illustrates an embodiment of a block for a computing system including multiple processors.

Referring now to FIG. 17, shown is a block diagram of a second system 1700 in accordance with an embodiment of the present invention. As shown in FIG. 17, multiprocessor system 1700 is a point-to-point interconnect system, and includes a first processor 1770 and a second processor 1780 coupled via a point-to-point interconnect 1750. Each of processors 1770 and 1780 may be some version of a processor. In one embodiment, 1752 and 1754 are part of a serial, point-to-point coherent interconnect fabric, such as a high-performance architecture. As a result, the invention may be implemented within the QPI architecture.

While shown with only two processors 1770, 1780, it is to be understood that the scope of the present invention is not so limited. In other embodiments, one or more additional processors may be present in a given processor.

Processors 1770 and 1780 are shown including integrated memory controller units 1772 and 1782, respectively. Processor 1770 also includes as part of its bus controller units point-to-point (P-P) interfaces 1776 and 1778; similarly, second processor 1780 includes P-P interfaces 1786 and 1788. Processors 1770, 1780 may exchange information via a point-to-point (P-P) interface 1750 using P-P interface circuits 1778, 1788. As shown in FIG. 17, IMCs 1772 and 1782 couple the processors to respective memories, namely a memory 1732 and a memory 1734, which may be portions of main memory locally attached to the respective processors.

Processors 1770, 1780 each exchange information with a chipset 1790 via individual P-P interfaces 1752, 1754 using point to point interface circuits 1776, 1794, 1786, 1798. Chipset 1790 also exchanges information with a high-performance graphics circuit 1738 via an interface circuit 1792 along a high-performance graphics interconnect 1739.

A shared cache (not shown) may be included in either processor or outside of both processors; yet connected with the processors via P-P interconnect, such that either or both processors' local cache information may be stored in the shared cache if a processor is placed into a low power mode.

Chipset 1790 may be coupled to a first bus 1716 via an interface 1796. In one embodiment, first bus 1716 may be a Peripheral Component Interconnect (PCI) bus, or a bus such as a PCI Express bus or another third generation I/O interconnect bus, although the scope of the present invention is not so limited.

As shown in FIG. 17, various I/O devices 1714 are coupled to first bus 1716, along with a bus bridge 1718 which couples first bus 1716 to a second bus 1720. In one embodiment, second bus 1720 includes a low pin count (LPC) bus. Various devices are coupled to second bus 1720 including, for example, a keyboard and/or mouse 1722, communication devices 1727 and a storage unit 1728 such as a disk drive or other mass storage device which often includes instructions/code and data 1730, in one embodiment. Further, an audio I/O 1724 is shown coupled to second bus 1720. Note that other architectures are possible, where the included components and interconnect architectures vary. For example, instead of the point-to-point architecture of FIG. 17, a system may implement a multi-drop bus or other such architecture.

Figure 18:
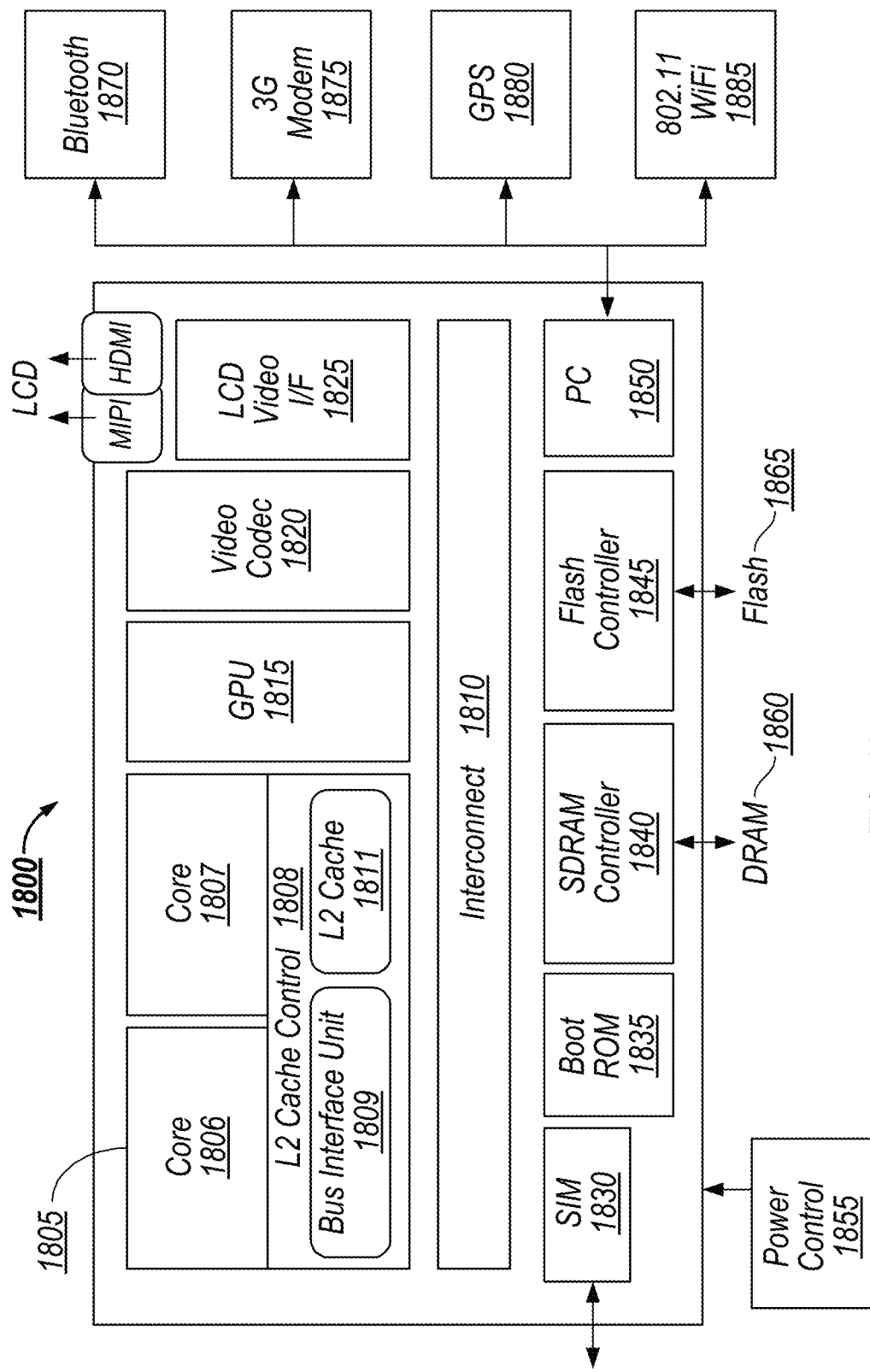
FIG. 18 illustrates an example system implemented as system on chip (SoC).

Turning next to FIG. 18, an embodiment of a system on-chip (SOC) design in accordance with the inventions is depicted. As a specific illustrative example, SOC 1800 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 1800 includes 2 cores—1806 and 1807. Similar to the discussion above, cores 1806 and 1807 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 1806 and 1807 are coupled to cache control 1808 that is associated with bus interface unit 1809 and L2 cache 1811 to communicate with other parts of system 1800. Interconnect 1810 includes an on-chip interconnect, such as an IOSF, AMBA, or other interconnect discussed above, which potentially implements one or more aspects of described herein.

Interface 1810 provides communication channels to the other components, such as a Subscriber Identity Module (SIM) 1830 to interface with a SIM card, a boot ROM 1835 to hold boot code for execution by cores 1806 and 1807 to initialize and boot SOC 1800, a SDRAM controller 1840 to interface with external memory (e.g. DRAM 1860), a flash controller 1845 to interface with non-volatile memory (e.g. Flash 1865), a peripheral control 1850 (e.g. Serial Peripheral Interface) to interface with peripherals, video codecs 1820 and Video interface 1825 to display and receive input (e.g. touch enabled input), GPU 1815 to perform graphics related computations, etc. Any of these interfaces may incorporate aspects of the invention described herein.

In addition, the system illustrates peripherals for communication, such as a Bluetooth module 1870, 3G modem 1875, GPS 1885, and WiFi 1885. Note as stated above, a UE includes a radio for communication. As a result, these peripheral communication modules are not all required. However, in a UE some form a radio for external communication is to be included.

While the present invention has been described with respect to a limited number of embodiments, those skilled in the art will appreciate numerous modifications and variations therefrom. It is intended that the appended claims cover all such modifications and variations as fall within the true spirit and scope of this present invention.

A design may go through various stages, from creation to simulation to fabrication. Data representing a design may represent the design in a number of manners. First, as is useful in simulations, the hardware may be represented using a hardware description language or another functional description language. Additionally, a circuit level model with logic and/or transistor gates may be produced at some stages of the design process. Furthermore, most designs, at some stage, reach a level of data representing the physical placement of various devices in the hardware model. In the case where conventional semiconductor fabrication techniques are used, the data representing the hardware model may be the data specifying the presence or absence of various features on different mask layers for masks used to produce the integrated circuit. In any representation of the design, the data may be stored in any form of a machine readable medium. A memory or a magnetic or optical storage such as a disc may be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider may store on a tangible, machine-readable medium, at least temporarily, an article, such as information encoded into a carrier wave, embodying techniques of embodiments of the present invention.

A module as used herein refers to any combination of hardware, software, and/or firmware. As an example, a module includes hardware, such as a micro-controller, associated with a non-transitory medium to store code adapted to be executed by the micro-controller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) may refer to the combination of the microcontroller and the non-transitory medium. Often module boundaries that are illustrated as separate commonly vary and potentially overlap. For example, a first and a second module may share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate may provide a 0 or a 1 during operation. But a logic gate 'configured to' provide an enable signal to a clock does not include every potential logic gate that may provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, may be capable of holding a single logical value or multiple logical values. However, other representations of values in computer systems have been used. For example the decimal number ten may also be represented as a binary value of 1010 and a hexadecimal letter A. Therefore, a value includes any representation of information capable of being held in a computer system.

Moreover, states may be represented by values or portions of values. As an example, a first value, such as a logical one, may represent a default or initial state, while a second value, such as a logical zero, may represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values may be utilized to represent any number of states.

The embodiments of methods, hardware, software, firmware or code set forth above may be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that may receive information there from.

Instructions used to program logic to perform embodiments of the invention may be stored within a memory in the system, such as DRAM, cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

In some embodiments, an electronic device may be configured to perform one or more processes, techniques, and/or methods as described herein, or portions thereof. One such process is depicted in Figure X-2. For example, the process may include performing, by a first and second retimer, an SKP adjustment during a first SKP ordered set (OS); and performing, by a third and fourth retimer, an SKP adjustment during a second SKP OS.

In some embodiments, an electronic device may be configured to perform one or more processes, techniques, and/or methods as described herein, or portions thereof. For example, the process may include enhancing a training ordered set (OS) to allow for five generations of speeds; and setting a configuration register to indicate a Gen 5 PCIe speed.

In some embodiments, an electronic device may be configured to perform one or more processes, techniques, and/or methods as described herein, or portions thereof. For example, the process may include identifying a channel type provided by a platform; identifying a presence of one or more retimers; and choosing, based on the channel type and whether one or more retimers are present, between 25 Gigatransfers per second (GT/s) and 32 GT/s.

In some embodiments, an electronic device may be configured to perform one or more processes, techniques, and/or methods as described herein, or portions thereof. For example, the process may include identifying a channel link width from a set that includes widths of ×20, ×24, ×28, and ×28; and communicating over a channel link based on the identified channel link width.

In some embodiments, an electronic device may be configured to perform one or more processes, techniques, and/or methods as described herein, or portions thereof. For example, the process may include identifying recovered clock data from clock data recovery (CDR); and transmitting, based on the recovered clock data, transmit (TX) data after an initial training.

In some embodiments, a method of communicating in accordance with a PCIe standard may be provided that includes performing, by a first and second retimer, an SKP adjustment during a first SKP ordered set (OS), and performing, by a third and fourth retimer, an SKP adjustment during a second SKP OS. The method can further include reducing a SKP OS frequency by half In some cases, the first SKP OS may be sent back-to-back with the second SKP OS. The method may further include enhancing a training ordered set (OS) to allow for five generations of speeds, and setting a configuration register to indicate a Gen 5 PCIe speed. Further, a channel type provided by a platform may be identified, the presence of one or more retimers may be identified, and the channel speed may be selected (e.g., from either 25 Gigatransfers per second (GT/s) or 32 GT/s) based on the channel type and whether one or more retimers are present. This selection may also be determined based on whether forward error correction (FEC) is enabled or supported. This speed selection may take place during link training. These example methods may additional include identifying a channel link width from a set that includes widths of ×20, ×24, ×28, and ×28, and communicating over a channel link based on the identified channel link width. Further, recovered clock data from a clock data recovery component may be identified, and transmit data may be sent based on the recovered clock data following training of the link.

In some embodiments, an apparatus may be provided to communicate in accordance with a PCIe-based standard, the apparatus including an extended continuous time linear equalizer (CTLE), and/or minimum 8-tap decision feedback equalizer (DFE), and/or a T-coil or Pi-coil termination, and/or a data pattern filter related to clock data recovery (CDR), and/or a 4-way interleaved clock architecture, among other example features and components.

In some embodiments, an apparatus may be provided to communicate in accordance with a peripheral component interconnect express (PCIe) standard with channel loss characteristics, such as discussed above. The PCIe standard may be a Gen 5 (or higher) PCIe standard.

The following examples pertain to embodiments in accordance with this Specification. Example 1 is an apparatus including a receiver to receive one or more training sequences during a training of a link, where the link is to connect two devices, agent logic to, determine, from the one or more training sequences, a number of extension devices on the link between the two devices, and determine that the number of extension devices exceeds a threshold number. The apparatus may further include a transmitter to send a plurality of clock compensation ordered sets on the link based on determining that the number of extension devices exceeds the threshold number.

Example 2 may include the subject matter of Example 2 may include the subject matter of example 1, where the plurality of clock compensation ordered sets are to be scheduled to be sent at a higher frequency based on determining that the number of extension devices exceeds the threshold number.

Example 3 may include the subject matter of example 2, where clock compensation ordered sets are scheduled to be sent according to a particular frequency when the number of extension devices does not exceed the threshold number, and the higher frequency is higher than the particular frequency.

Example 4 may include the subject matter of example 1, where the plurality of clock compensation ordered sets are to be sent consecutively based on determining that the number of extension devices exceeds the threshold number.

Example 5 may include the subject matter of example 4, where the plurality of clock compensation ordered sets include two clock compensation ordered sets sent according to a particular frequency, and a single clock compensation ordered set is to be sent according to the particular frequency when the number of extension devices does not exceed the threshold number.

Example 6 may include the subject matter of any one of examples 1-5, where the clock compensation ordered set includes a SKP ordered set.

Example 7 may include the subject matter of example 6, where the link is according to a Peripheral Component Interconnect Express (PCIe)-based protocol and the SKP ordered set is according to the PCIe-based protocol.

Example 8 may include the subject matter of any one of examples 1-7, where the number of extension devices is determined from one or more fields of the training sequences encoded by the extension devices to indicate the number of the extension devices.

Example 9 may include the subject matter of example 8, where the link is defined to support a maximum number of extension devices, the one or more fields include a number of fields corresponding to the maximum number of extension devices, and each one of the extension devices is to encode a respective one of the number of fields to indicate presence of the corresponding extension device on the link.

Example 10 may include the subject matter of any one of examples 8-9, where the maximum number of extension devices includes four extension devices.

Example 11 may include the subject matter of any one of examples 1-10, where the extension devices include retimer devices.

Example 12 is a method including: receiving one or more training sequences at a particular device during a training of a link, where the link is to connect the particular device to another device; determining, from the one or more training sequences, a number of extension devices on the link between the particular device and the other device; determining that the number of extension devices exceeds a threshold number; and sending a plurality of clock compensation ordered sets on the link based on determining that the number of extension devices exceeds the threshold number.

Example 13 may include the subject matter of example 12, where the plurality of clock compensation ordered sets are to be scheduled to be sent at a higher frequency based on determining that the number of extension devices exceeds the threshold number.

Example 14 may include the subject matter of example 13, where clock compensation ordered sets are scheduled to be sent according to a particular frequency when the number of extension devices does not exceed the threshold number, and the higher frequency is higher than the particular frequency.

Example 15 may include the subject matter of example 12, where the plurality of clock compensation ordered sets are to be sent consecutively based on determining that the number of extension devices exceeds the threshold number.

Example 16 may include the subject matter of example 15, where the plurality of clock compensation ordered sets include two clock compensation ordered sets sent according to a particular frequency, and a single clock compensation ordered set is to be sent according to the particular frequency when the number of extension devices does not exceed the threshold number.

Example 17 may include the subject matter of any one of examples 12-16, where the clock compensation ordered set includes a SKP ordered set.

Example 18 may include the subject matter of example 17, where the link is according to a Peripheral Component Interconnect Express (PCIe)-based protocol and the SKP ordered set is according to the PCIe-based protocol.

Example 19 may include the subject matter of any one of examples 12-18, where the number of extension devices is determined from one or more fields of the training sequences encoded by the extension devices to indicate the number of the extension devices.

Example 20 may include the subject matter of example 19, where the link is defined to support a maximum number of extension devices, the one or more fields include a number of fields corresponding to the maximum number of extension devices, and each one of the extension devices is to encode a respective one of the number of fields to indicate presence of the corresponding extension device on the link.

Example 21 may include the subject matter of any one of examples 19-20, where the maximum number of extension devices includes four extension devices.

Example 22 may include the subject matter of any one of examples 12-21, where the extension devices include retimer devices.

Example 23 is a computer readable storage medium with instructions stored thereon, the instructions executable by a processor to: receive one or more training sequences at a particular device during a training of a link, where the link is to connect the particular device to another device; determine, from the one or more training sequences, a number of extension devices on the link between the particular device and the other device; determine that the number of extension devices exceeds a threshold number; and send a plurality of clock compensation ordered sets on the link based on determining that the number of extension devices exceeds the threshold number.

Example 24 may include the subject matter of example 23, where the plurality of clock compensation ordered sets are to be scheduled to be sent at a higher frequency based on determining that the number of extension devices exceeds the threshold number.

Example 25 may include the subject matter of example 24, where clock compensation ordered sets are scheduled to be sent according to a particular frequency when the number of extension devices does not exceed the threshold number, and the higher frequency is higher than the particular frequency.

Example 26 may include the subject matter of example 23, where the plurality of clock compensation ordered sets are to be sent consecutively based on determining that the number of extension devices exceeds the threshold number.

Example 27 may include the subject matter of example 26, where the plurality of clock compensation ordered sets include two clock compensation ordered sets sent according to a particular frequency, and a single clock compensation ordered set is to be sent according to the particular frequency when the number of extension devices does not exceed the threshold number.

Example 28 may include the subject matter of any one of examples 23-27, where the clock compensation ordered set includes a SKP ordered set.

Example 29 may include the subject matter of example 28, where the link is according to a Peripheral Component Interconnect Express (PCIe)-based protocol and the SKP ordered set is according to the PCIe-based protocol.

Example 30 may include the subject matter of any one of examples 23-29, where the number of extension devices is determined from one or more fields of the training sequences encoded by the extension devices to indicate the number of the extension devices.

Example 31 may include the subject matter of example 30, where the link is defined to support a maximum number of extension devices, the one or more fields include a number of fields corresponding to the maximum number of extension devices, and each one of the extension devices is to encode a respective one of the number of fields to indicate presence of the corresponding extension device on the link.

Example 32 may include the subject matter of any one of examples 30-31, where the maximum number of extension devices includes four extension devices.

Example 33 may include the subject matter of any one of examples 23-32, where the extension devices include retimer devices.

Example 34 is an apparatus including: retimer that includes retiming logic to forward data received on a link from another device on the link and clock compensation logic to: detect a clock difference; determine a number of symbols to remove from or add to a clock compensation ordered set based on the clock difference; receive a plurality of clock compensation ordered sets on the link; and identify that a last one of the plurality of clock compensation ordered sets is to be used by the retimer to remove or add symbols to the last clock compensation ordered set based on the clock difference.

Example 35 may include the subject matter of example 34, where the clock compensation ordered set is according to a defined format, the defined format designates a subset of symbols of the clock compensation ordered set for removal to achieve clock compensation, and the last clock compensation ordered set is to be used based on the subset of symbols of a prior clock compensation ordered set in the plurality of clock compensation ordered sets having been already moved by another retimer on the link.

Example 36 may include the subject matter of example 35, where the clock compensation logic removes symbols from the last clock compensation ordered set based on the clock difference, and the retimer further includes a transmitter to transmit the last clock compensation ordered set with the removed symbols to another device on the link.

Example 37 may include the subject matter of any one of examples 34-36, where the plurality of clock compensation ordered sets includes two consecutive ordered sets, and the two consecutive ordered sets include the last clock compensation ordered set and the prior clock compensation ordered set.

Example 38 may include the subject matter of example 37, where the prior clock compensation ordered set includes a first one of the plurality of clock compensation ordered sets.

Example 39 is a method including: detect a clock difference at a retimer device; determine a number of symbols to remove from or add to a clock compensation ordered set based on the clock difference; receive a plurality of clock compensation ordered sets on the link; and identify that a last one of the plurality of clock compensation ordered sets is to be used by the retimer to remove or add symbols to the last clock compensation ordered set based on the clock difference.

Example 40 may include the subject matter of example 34, where the clock compensation ordered set is according to a defined format, the defined format designates a subset of symbols of the clock compensation ordered set for removal to achieve clock compensation, and the last clock compensation ordered set is to be used based on the subset of symbols of a prior clock compensation ordered set in the plurality of clock compensation ordered sets having been already moved by another retimer on the link.

Example 41 may include the subject matter of example 35, further including: removing symbols from the last clock compensation ordered set based on the clock difference; and transmitting the last clock compensation ordered set with the removed symbols to another device on the link.

Example 42 may include the subject matter of any one of examples 34-36, where the plurality of clock compensation ordered sets includes two consecutive ordered sets, and the two consecutive ordered sets include the last clock compensation ordered set and the prior clock compensation ordered set.

Example 43 may include the subject matter of example 37, where the prior clock compensation ordered set includes a first one of the plurality of clock compensation ordered sets.

Example 44 is a computer readable storage medium with instructions stored thereon, the instructions executable by a machine to: detect a clock difference at a retimer device; determine a number of symbols to remove from or add to a clock compensation ordered set based on the clock difference; receive a plurality of clock compensation ordered sets on the link; and identify that a last one of the plurality of clock compensation ordered sets is to be used by the retimer to remove or add symbols to the last clock compensation ordered set based on the clock difference.

Example 45 may include the subject matter of example 44, where the clock compensation ordered set is according to a defined format, the defined format designates a subset of symbols of the clock compensation ordered set for removal to achieve clock compensation, and the last clock compensation ordered set is to be used based on the subset of symbols of a prior clock compensation ordered set in the plurality of clock compensation ordered sets having been already moved by another retimer on the link.

Example 46 may include the subject matter of example 45, where the instructions, when executed, further cause the machine to: remove symbols from the last clock compensation ordered set based on the clock difference; and transmit the last clock compensation ordered set with the removed symbols to another device on the link.

Example 47 may include the subject matter of any one of examples 44-46, where the plurality of clock compensation ordered sets includes two consecutive ordered sets, and the two consecutive ordered sets include the last clock compensation ordered set and the prior clock compensation ordered set.

Example 48 may include the subject matter of example 47, where the prior clock compensation ordered set includes a first one of the plurality of clock compensation ordered sets.

Example 49 is a system including a first device, a second device, and a plurality of retimer devices positioned between the first and second devices on a link to connect the first and second devices. The first device includes logic to determine, during training of the link, a number of retimer devices in the plurality of retimer devices, determine that the number of retimer devices exceeds a threshold number, and send a plurality of clock compensation ordered sets on the link based on determining that the number of retimer devices exceeds the threshold number.

Example 50 may include the subject matter of example 49, where each of the plurality of retimer devices is to determine whether to add or remove symbols from the plurality of clock compensation ordered sets to remedy a respective clock difference identified at the corresponding retimer device.

Example 51 may include the subject matter of any one of examples 49-50, where the plurality of clock compensation ordered sets are to be scheduled to be sent at a higher frequency based on determining that the number of extension devices exceeds the threshold number.

Example 52 may include the subject matter of any one of examples 49-50, where the plurality of clock compensation ordered sets are to be sent consecutively based on determining that the number of extension devices exceeds the threshold number.

Example 53 may include the subject matter of any one of examples 49-52, where the plurality of retimer devices includes at least four retimer devices.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In the foregoing specification, a detailed description has been given with reference to specific exemplary embodiments. It will, however, be evident that various modifications and changes may be made thereto without departing from the broader spirit and scope of the invention as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but may refer to different and distinct embodiments, as well as potentially the same embodiment.

What is claimed is:

1. An apparatus comprising:
   a port to couple to a device over an interconnect, wherein the port comprises protocol circuitry to:
   send a particular training sequence on the interconnect in association with training of a link on the interconnect, wherein the link is compliant with a Peripheral Component Interconnect Express (PCIe)-based protocol, the sent training sequence is a TS2-type training sequence based on the PCIe-based protocol, TS2-type training sequences are defined to comprise a set of symbols and a particular one of the set of symbols comprises bits defined by the PCIe-based protocol to identify whether a number of retimers are present on the link, wherein the particular training sequence is sent in-band on the interconnect;

receive a training sequence on the interconnect during the training of the link, wherein the received training sequence is also a TS2-type training sequence, the bits in the particular symbol of the received training sequence indicate a particular number of retimers present on the link, wherein the particular number of retimers are positioned between the port and the device on the interconnect; and participate with the number of retimers in equalization of the link during the training of the link, wherein training of the link comprises the equalization of the link, and the equalization of the link is based on the particular number of retimers present on the link.

2. The apparatus of claim 1, wherein the protocol circuitry is to train the link to operate at a speed of 16.0 gigatransfers/second (GT/s).

3. The apparatus of claim 1, wherein the PCIe-based protocol comprises PCIe Generation 4.0.

4. The apparatus of claim 1, wherein the particular symbol comprises symbol 5 of the TS2-type training sequence.

5. The apparatus of claim 1, wherein the received training sequence is responsive to the sent training sequence.

6. The apparatus of claim 1, wherein the particular number of retimers comprises zero, one, or two retimers.

7. The apparatus of claim 1, wherein the protocol circuitry is further to send a SKP ordered set (SKP OS) on the link, and the SKP OS is to be used to perform clock compensation for the link.

8. An apparatus comprising:
a retimer to extend a physical length of a link, wherein the link is to couple a first device to a second device, and the retimer is to be positioned between the first device and second device on the link, wherein the link is compliant with a PCIe-based protocol, and the retimer comprises protocol circuitry to:
receive a first TS2 training sequence sent by the first device on a first link segment of the link, wherein the first link segment connects the first device to the retimer, the first TS2 training sequence is based on the PCIe-based protocol, the first TS2 training sequence comprises a particular symbol, and the particular symbol comprises a set of bits defined by the PCIe-based protocol to identify presence of retimers on the link, wherein the first TS2 training sequence is received in-band on the interconnect;
regenerate the first TS2 training sequence to forward to the second device on a second link segment of the link, wherein the second link segment connects the retimer to the second device, and the first TS2 training sequence is regenerated to include a value in the set of bits to identify presence of the retimer on the link;
send the regenerated first TS2 training sequence to the second device on the second link segment; and
participate in an equalization of the link during training of the link based on the PCIe-based protocol, wherein the training of the link comprises the equalization of the link, and the equalization of the link is based on the presence of retimers on the link.

9. The apparatus of claim 8, wherein the particular symbol comprises symbol 5 of the first TS2 training sequence.

10. The apparatus of claim 8, wherein the protocol circuitry is further to:
receive a second TS2 training sequence from the second device over the second link segment, wherein the second TS2 training sequence comprises the particular symbol; and
forward the second TS2 training sequence to the first device over the first link segment, wherein the second TS2 training sequence is a looped-back version of the first TS2 training sequence.

11. The apparatus of claim 10, wherein the protocol circuitry is further to regenerate the second TS2 training sequence to include a particular value in the set of bits of the particular symbol in the second TS2 training sequence to identify presence of the retimer, and the regenerated second TS2 training sequence is forwarded to the first device.

12. The apparatus of claim 8, wherein the equalization comprises transmitter equalization at the retimer.

13. The apparatus of claim 8, wherein the protocol circuitry is further to:
receive an ordered set from the first device on the first link segment; and
identify that the ordered set comprises a SKP ordered set (SKP OS) based on the PCIe-based protocol.

14. The apparatus of claim 13, wherein the protocol circuitry is further to remove a symbol from the SKP OS to perform clock compensation for the link.

15. A system comprising:
a first device;
a second device; and
a retimer, wherein the first device and the second device are coupled by a physical interconnect, the retimer is positioned between the first device and the second device on the interconnect, the retimer is to extend the physical length of a link to be established on the interconnect, and the first device comprises protocol circuitry to:
send a particular training sequence on the interconnect in association with training of the link, wherein the link is compliant with a Peripheral Component Interconnect Express (PCIe)-based protocol, the sent training sequence is a TS2-type training sequence based on the PCIe-based protocol, TS2-type training sequences are defined to comprise a set of symbols and a particular one of the set of symbols comprises bits defined by the PCIe-based protocol to identify whether a number of retimers are present on the link, wherein the particular training sequence is sent in-band on the interconnect;
receive a training sequence on the interconnect during the training of the link, wherein the received training sequence is also a TS2-type training sequence, the bits in the particular symbol of the received training sequence indicate a particular number of retimers present on the link, wherein the particular number of retimers comprise the retimer; and
participate with the number of retimers in equalization of the link during the training of the link, wherein training of the link comprises the equalization of the link, and the equalization of the link is based on the particular number of retimers present on the link.

16. The system of claim 15, wherein the retimer comprises circuitry to:
- receive the particular training sequence from the first device on a first link segment formed on the interconnect to physically couple the first device to the retimer;
- set a value in the bits in the particular symbol to identify presence of the retimer on the link;
- forward the particular training sequence to the second device on a second link segment, wherein the training sequence forwarded to the second device comprises the value in the bits in the particular symbol, and the second link segment physically connects the retimer to the second device.

17. The system of claim 16, wherein the particular symbol comprises symbol 5 of a PCIe TS2 training sequence.

18. The system of claim 16, wherein the PCIe-based protocol comprises PCIe 4.0.

19. The system of claim 15, wherein one of the first device or the second device comprises an accelerator device.

20. The system of claim 15, wherein one of the first device or the second device comprises a memory device.

21. The system of claim 15, wherein one of the first device or the second device comprises a graphics device.

22. The system of claim 15, wherein one of the first device or the second device comprises a network controller.

* * * * *